(12) United States Patent
Chen et al.

(10) Patent No.: US 12,183,573 B2
(45) Date of Patent: Dec. 31, 2024

(54) DEVICE AND METHOD FOR HIGH PRESSURE ANNEAL

(71) Applicant: Taiwan Semiconductor Manufacturing Co., Ltd., Hsinchu (TW)

(72) Inventors: Szu-Ying Chen, Hsinchu (TW); Ya-Wen Chiu, Tainan (TW); Cheng-Po Chau, Tainan (TW); Yi Che Chan, Hsinchu (TW); Chih Ping Liao, Hsinchu (TW); YungHao Wang, Hsinchu (TW); Sen-Hong Syue, Zhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/365,517

(22) Filed: Aug. 4, 2023

(65) Prior Publication Data
US 2023/0386832 A1  Nov. 30, 2023

Related U.S. Application Data

(62) Division of application No. 17/329,477, filed on May 25, 2021, now Pat. No. 11,854,800, which is a
(Continued)

(51) Int. Cl.
| | |
|---|---|
| *H01L 21/02* | (2006.01) |
| *H01L 21/762* | (2006.01) |
| *H01L 21/768* | (2006.01) |
| *H01L 21/8234* | (2006.01) |
| *H01L 29/66* | (2006.01) |

(52) U.S. Cl.
CPC .......... *H01L 21/02321* (2013.01); *H01L 21/02271* (2013.01); *H01L 21/02345* (2013.01); *H01L 21/02373* (2013.01); *H01L 21/76224* (2013.01); *H01L 21/76883* (2013.01); *H01L 21/76895* (2013.01); *H01L 21/823481* (2013.01); *H01L 29/66545* (2013.01); *H01L 29/66795* (2013.01)

(58) Field of Classification Search
CPC ......... H01L 21/02337; H01L 21/02321; H01L 21/67207; H01L 21/67389; H01L 21/67098; H01L 21/67109
See application file for complete search history.

(56) References Cited

U.S. PATENT DOCUMENTS

| | | | |
|---|---|---|---|
| 10,211,092 | B1 | 2/2019 | Cheng et al. |
| 2002/0151142 | A1 | 10/2002 | Callegari et al. |
| (Continued) | | | |

FOREIGN PATENT DOCUMENTS

| | | |
|---|---|---|
| CN | 104217949 A | 12/2014 |
| JP | 2004006288 A | 1/2004 |

*Primary Examiner* — John A Bodnar
(74) *Attorney, Agent, or Firm* — Slater Matsil, LLP

(57) ABSTRACT

Embodiment methods for performing a high pressure anneal process during the formation of a semiconductor device, and embodiment devices therefor, are provided. The high pressure anneal process may be a dry high pressure anneal process in which a pressurized environment of the anneal includes one or more process gases. The high pressure anneal process may be a wet anneal process in which a pressurized environment of the anneal includes steam.

20 Claims, 33 Drawing Sheets

Related U.S. Application Data division of application No. 16/417,007, filed on May 20, 2019, now Pat. No. 11,037,781.

(60) Provisional application No. 62/692,168, filed on Jun. 29, 2018.

(56) References Cited

U.S. PATENT DOCUMENTS

| | | |
|---|---|---|
| 2006/0094194 A1 | 5/2006 | Chen et al. |
| 2009/0039428 A1 | 2/2009 | Wu et al. |
| 2009/0148965 A1 | 6/2009 | Kim et al. |
| 2014/0329027 A1 | 11/2014 | Liang et al. |
| 2015/0132972 A1 | 5/2015 | Wada et al. |
| 2017/0053912 A1 | 2/2017 | Ching et al. |
| 2018/0122630 A1 | 5/2018 | Leschkies et al. |
| 2018/0248004 A1 | 8/2018 | Majhi et al. |
| 2019/0259625 A1 | 8/2019 | Nemani et al. |
| 2019/0311896 A1* | 10/2019 | Balseanu ............... C23C 16/345 |
| 2021/0287901 A1 | 9/2021 | Leonard et al. |

* cited by examiner

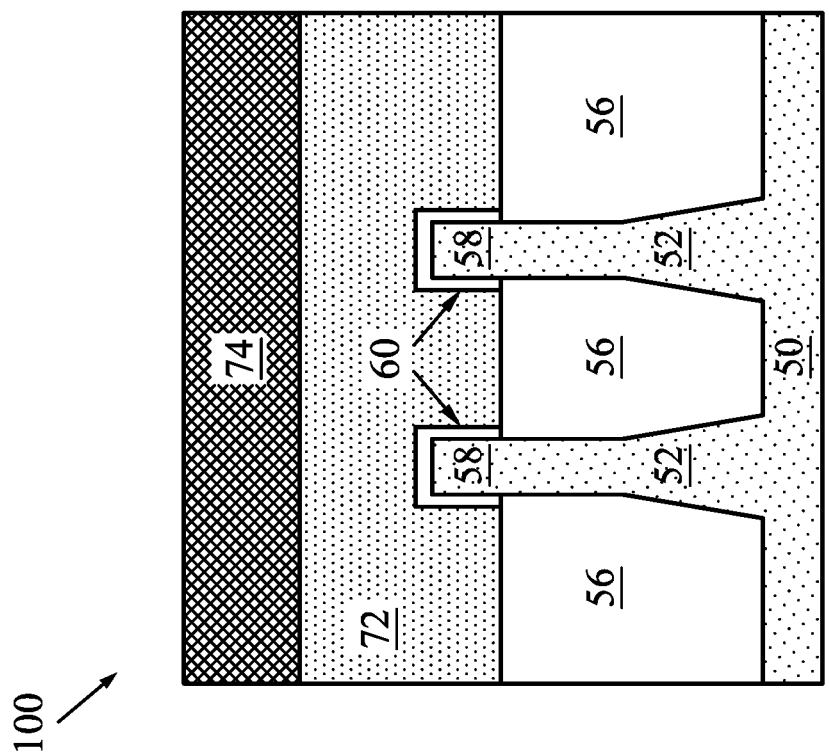
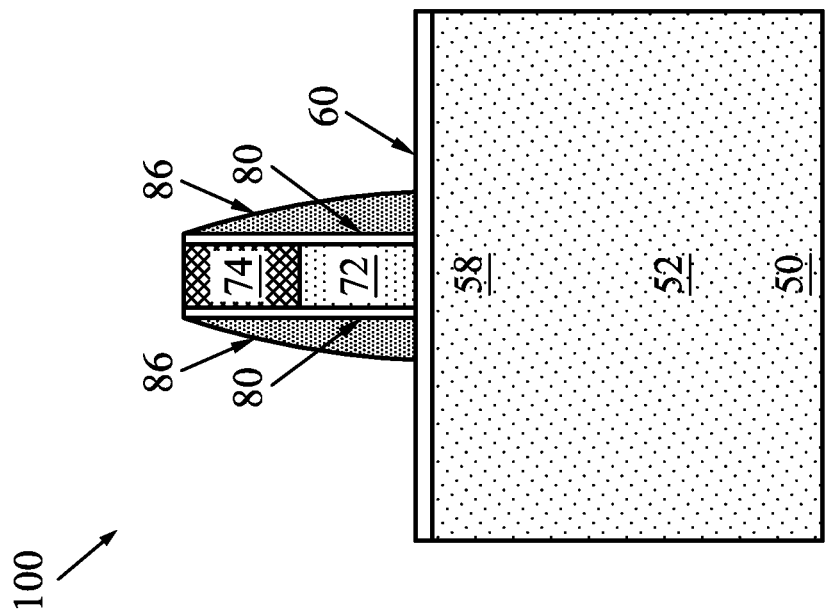
Figure 15A
Figure 15B

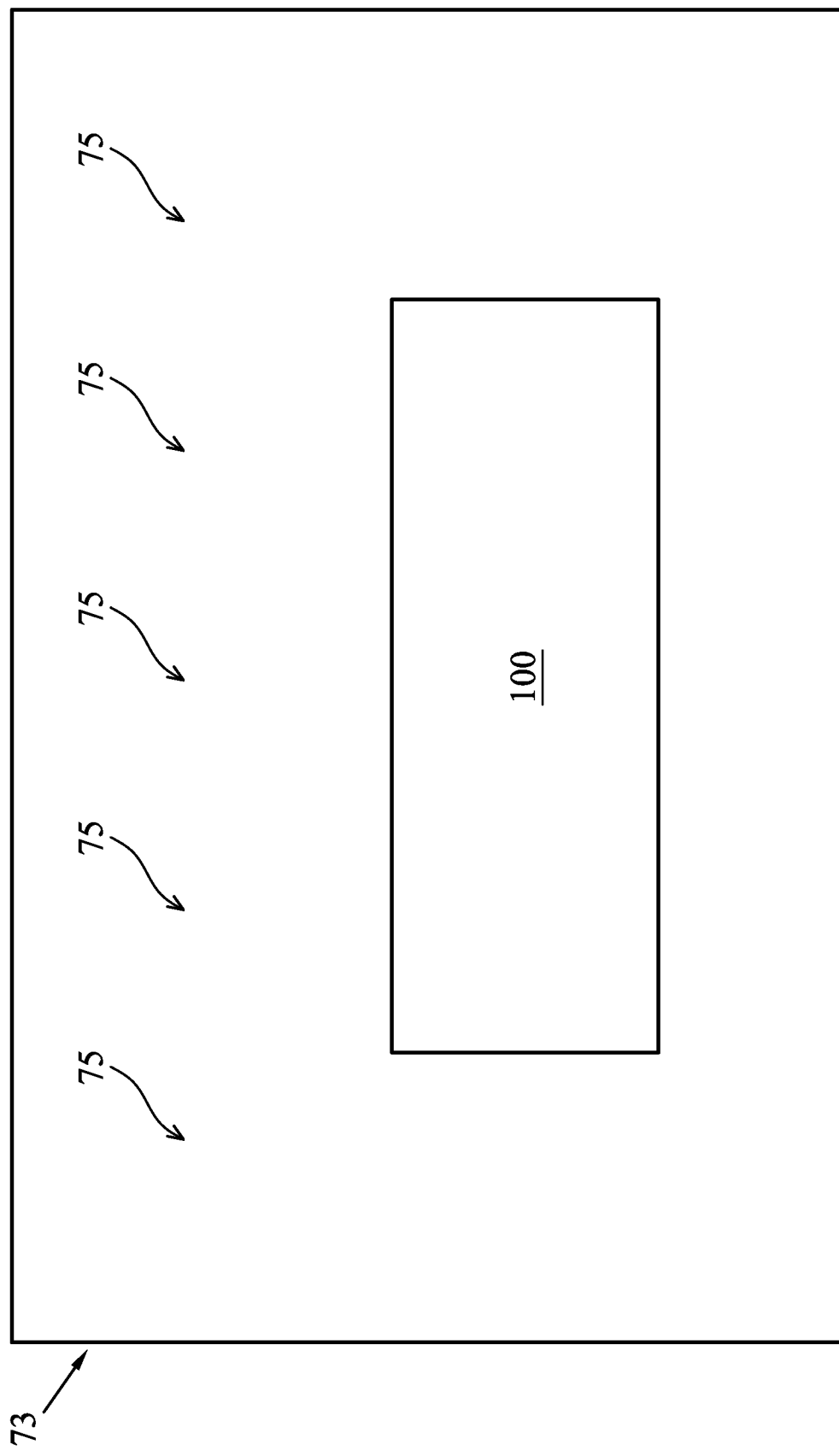

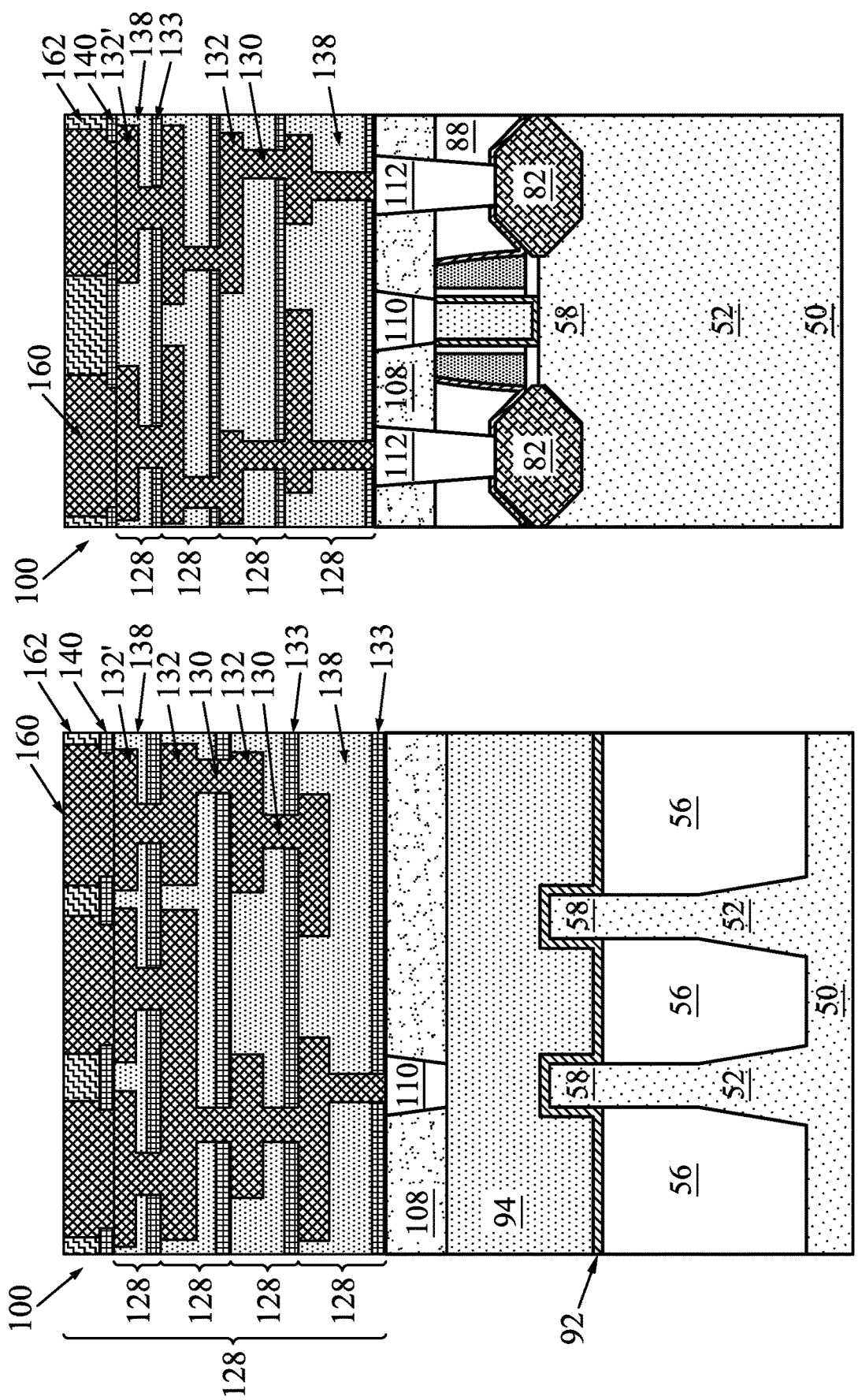

DEVICE AND METHOD FOR HIGH PRESSURE ANNEAL

PRIORITY CLAIM AND CROSS-REFERENCE

This application is a divisional of U.S. patent application Ser. No. 17/329,477 filed on May 25, 2021, entitled "Device and Method for High Pressure Anneal," which is a divisional of U.S. patent application Ser. No. 16/417,007 filed on May 20, 2019, entitled "Device and Method for High Pressure Anneal," now U.S. Pat. No. 11,037,781, issued on Jun. 15, 2021, which claims priority to U.S. Provisional Application No. 62/692,168, filed Jun. 29, 2018, which applications are hereby incorporated by reference in their entirety.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 11-13, 14A, 14B, 15A, 15B, 16A, 16B, 16C, 16D, 17A, 17B, 17C, and 18, are cross sectional views of intermediate stages of the manufacture of a FinFET device in accordance with some embodiments.

FIG. 19 depicts a FinFET device undergoing an anneal process in accordance with some embodiments.

FIGS. 20A, 20B, 20C, 21, 22A, 22B, 23A, 23B, 24A, 24B, 25A, 25B, 26A, 26B, 27A, and 27B, are cross sectional views of intermediate stages of the manufacture of a FinFET device in accordance with some embodiments.

DETAILED DESCRIPTION

Figure 1:
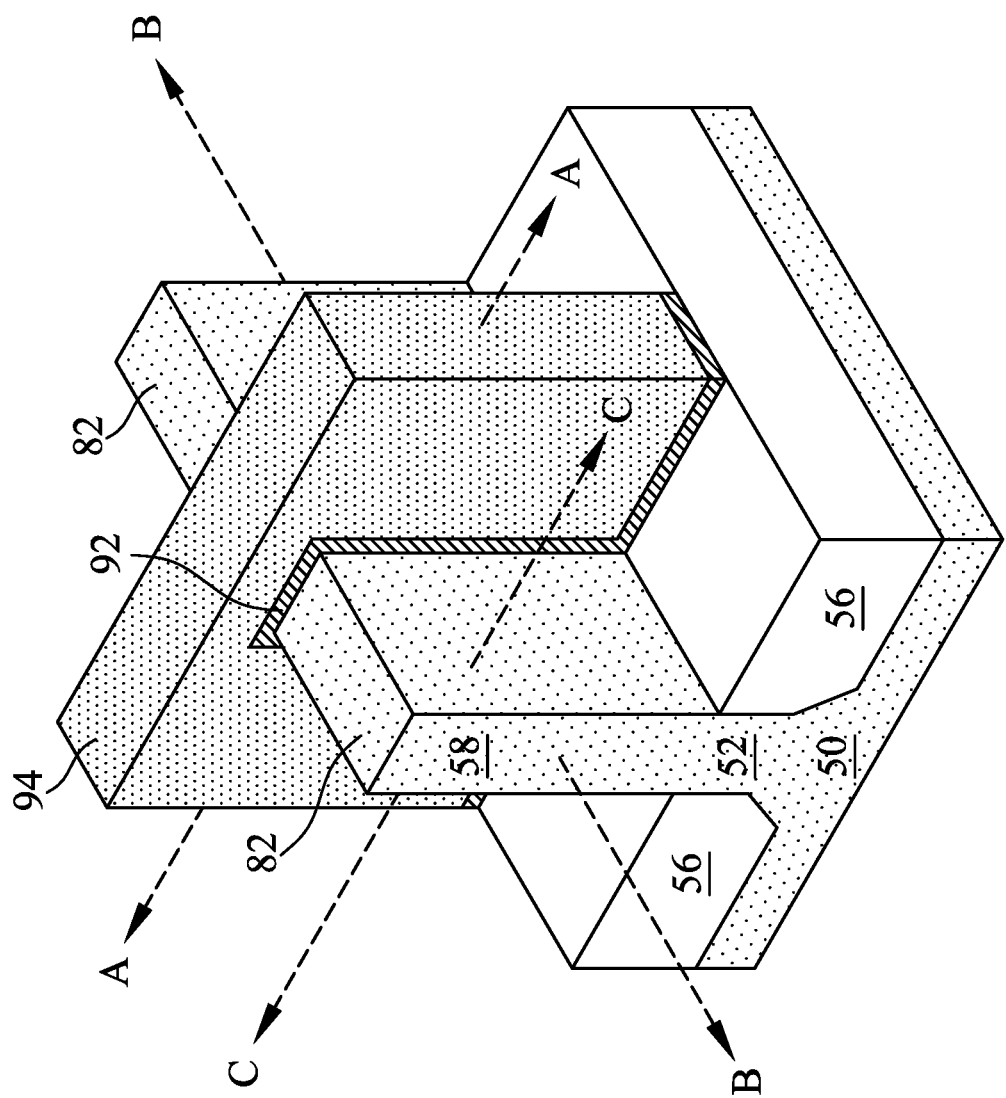
FIG. 1 is a perspective view of a fin field effect transistor (FinFET) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide processes for performing a high pressure anneal process one or multiple times during the forming of a semiconductor device, and devices for performing a high pressure anneal process. For example, one or more high pressure anneal processes may be performed on a semiconductor device after the formation of an insulation material of a shallow trench isolation (STI) region, after the formation of a interlayer dielectric (ILD) layer over a dummy gate, and/or after the formation of an interconnect structure. The high pressure anneal processes may be wet anneal processes or dry anneal processes. In the high pressure wet anneal process, a pressurized process environment may be created using pressurized steam. In the high pressure dry anneal process, a pressurized process environment may be created using a pressurized gas. In some embodiments, one or more high pressure wet anneal processes may be performed on a semiconductor device after the formation of an insulation material of a STI region and/or after the formation of an ILD layer over a dummy gate. In some embodiments, a high pressure dry anneal process may be performed on a semiconductor device after the formation of an interconnect structure.

In some embodiments, the insulation material of the STI region and/or an ILD layer may be formed using a flowable CVD (FCVD) process. For example, a CVD-based material may be deposited (for example using a remote plasma system). A post curing conversion process may be used to make the CVD-based material convert to another material, such as an oxide. In some circumstances, the film conversion may not be complete. For example, in an example conversion process oxygen (or another suitable molecule) is diffused into a film to form an oxide. The oxygen may not diffuse as far into the film as is desired, or may not diffuse into some parts of the film in a sufficient concentration, leading to an incomplete film conversion. This problem may be exacerbated when oxygen is being diffused into an area of a film having a high aspect ratio, such as a STI region between two adjacent fins, or an ILD layer between two adjacent dummy gates. The failure of the film to fully convert into the desired oxide may result in undesirably high levels of impurities in the film, and/or may otherwise result in a poor quality film. In some embodiments, performing one or more high pressure wet anneal processes may allow the oxygen to diffuse farther into the film, and/or may allow the oxygen to diffuse into some or all of the film in higher concentrations, which may achieve a more complete film conversion process. The high pressure wet anneal process(es) may reduce the levels of impurities in the film, and result in the creation of a higher quality film. In some embodiments, the high pressure wet anneal process(es) may achieve a desired result (e.g. more complete film conversion) with a lower temperature being used, for example as compared to a non-pressurized wet anneal process.

In some devices, an interconnect structure may contain multiple layers of different materials. For example, the interconnect region may include multiple dielectric layers that are respectively separated by one or more etch stop layers. In some cases, dangling bonds may be present in the interconnect region between two adjacent layers (e.g. a dielectric layer and an etch stop layer). The high pressure dry anneal process(es) may help to repair dangling bonds present along the interface. For example, during the high pressure dry anneal process(es) molecules (e.g. $H_2$ molecules) may penetrate into the interconnect structure to the interface, and may react with the dangling bonds to repair (for example by termination) the dangling bonds. In this manner, defects may be repaired and reliability may be improved.

Further, the high pressure dry anneal process(es) may help to fix imperfections in bonds in the channel region. For example, in some devices one or more dangling bonds may be present between a channel region of a fin and a gate dielectric layer. The dangling bonds may result in reduced channel mobility and/or poor recovery ability. The high pressure dry anneal process(es) may help to repair the channel region dangling bonds in a similar manner as described above, leading to higher mobility and improved recovery ability.

In some embodiments, a processing device for performing a high pressure anneal process includes an inner shell that is contained within an outer shell. The high pressure anneal process may be performed within the inner chamber of the inner shell. The outer shell may be formed of metal, and may be formed to withstand high pressures. For a high pressure dry anneal process, process gases may be provided to the device from pressurized bottles, and the process gases may flow from the bottles to the inner chamber of the inner shell using welded pipes, thereby raising the pressure of the inner shell to a desired pressure. For a high pressure wet anneal process, hot de-ionized (DI) water may flow from a source through welded pipes into the inner chamber of the inner shell, and the temperature of the processing device (or a suitable heating element, e.g. an inline heating element) may convert the hot DI water to pressurized steam. Various valves and measurement devices may be provided along the piping. A wafer boat, disposed on a wafer chuck, may be provided to support one or more semiconductor devices during the high pressure anneal processes.

Before the high pressure anneal process begins, the wafer chuck may be disposed remotely from the inner chamber of the inner shell, for example in a loading chamber adjacent to the outer shell. The wafer boat carrying semiconductor devices to be high pressure annealed is loaded onto the wafer chuck. Upon initiation of the high pressure anneal process, the wafer chuck is moved into place, placing the wafer boat within the inner shell. The outer shell and the inner shell are sealed for the high pressure anneal. One or more pressurized process gases, or hot water (to create steam), are piped into the inner process chamber, thereby raising the pressure of the inner chamber to a desired pressure. The temperature is raised to the desired anneal temperature. Following the high pressure anneal process, an outlet may be used to depressurize the inner process chamber and/or to remove process gases from the inner process chamber. One or more burners may be used to burn off remaining process gases flowing through the outlet. In some embodiments, diluted nitrogen may be added to the process gas outlet to dilute any remaining process gases in the outlet.

When a high pressure dry anneal process completes, the inner chamber of the inner shell is flushed of potentially dangerous gases using another, less dangerous gas. For example, nitrogen (or diluted nitrogen) is pumped into the inner process chamber to flush the chamber of combustible or poisonous gas. A gas detector is included in the outlet, and detects the current levels of gases in the inner chamber (and/or the adjacent loading chamber). A controller connected to the gas detector controls the wafer chuck to remain in place in the inner chamber until the levels have dropped past a set point. After the levels drop to a set point, the controller controls the wafer chuck to be removed from its place in the inner chamber and to return to the loading chamber. The semiconductor devices may then be removed for subsequent processing.

Various embodiments are discussed herein in a particular context, namely, forming a FinFET transistor. However, various embodiments may be applied to other semiconductor devices/processes, such as planar transistors, and the like.

FIG. 1 illustrates an example of a FinFET in a three-dimensional view, in accordance with some embodiments. The FinFET comprises a fin 58 on a substrate 50 (e.g., a semiconductor substrate). Isolation regions 56 are disposed on the substrate 50, and the fin 58 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. A gate dielectric layer 92 is along sidewalls and over a top surface of the fin 58, and a gate electrode 94 is over the gate dielectric layer 92. Source/drain regions 82 are disposed in opposite sides of the fin 58 with respect to the gate dielectric layer 92 and gate electrode 94.

FIG. 1 further illustrates reference cross-sections that are used in later figures. Cross-section A-A is along a longitudinal axis of the gate electrode 94 and in a direction, for example perpendicular to the direction of current flow between the source/drain regions 82 of the FinFET. Cross-section B-B is perpendicular to cross-section A-A and is along a longitudinal axis of the fin 58 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

Figure 21:
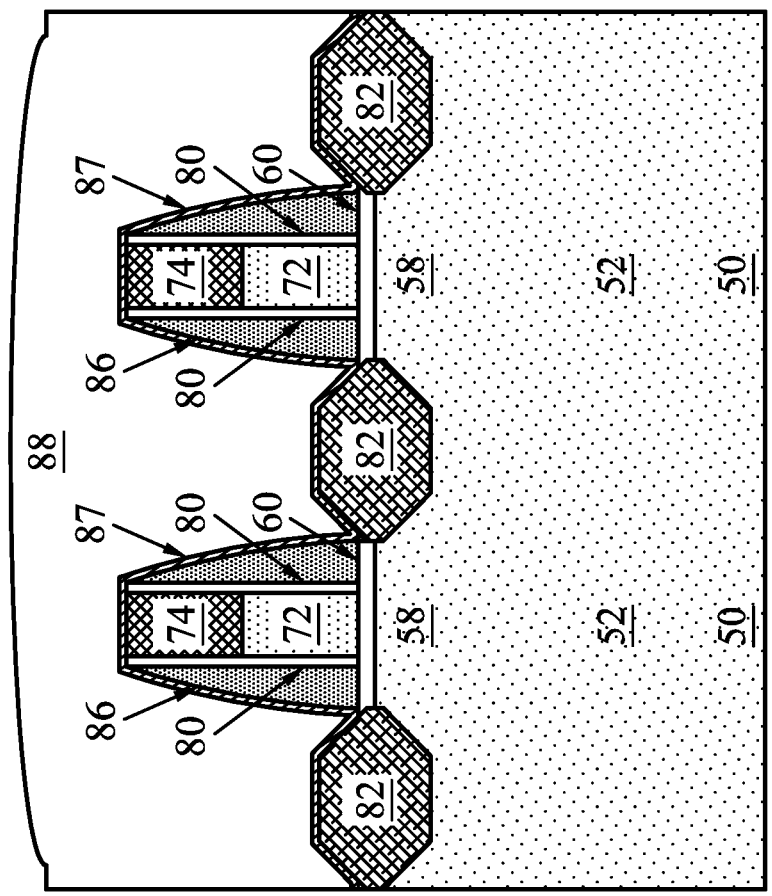

FIGS. 2 through 6, 11-18, and 20-27 are cross-sectional views of intermediate stages in the manufacturing of FinFETs in accordance with some embodiments. FIGS. 2 through 6, and 11-13, illustrate reference cross-section A-A illustrated in FIG. 1, except for multiple fins/FinFETs. In FIGS. 14A through 17C, 20A-C, and 22A through 27B, figures ending with an "A" designation are illustrated along reference cross-section A-A illustrated in FIG. 1, and figures ending with a "B" designation are illustrated along a similar cross-section B-B illustrated in FIG. 1, except for multiple fins/FinFETs. FIGS. 16C, 16D, 17C, and 20C are illustrated along reference cross-section C-C illustrated in FIG. 1, except for multiple fins/FinFETs. FIGS. 18 and 21 are illustrated along cross section A-A illustrated in FIG. 1, but for multiple FinFETs.

Figure 2:
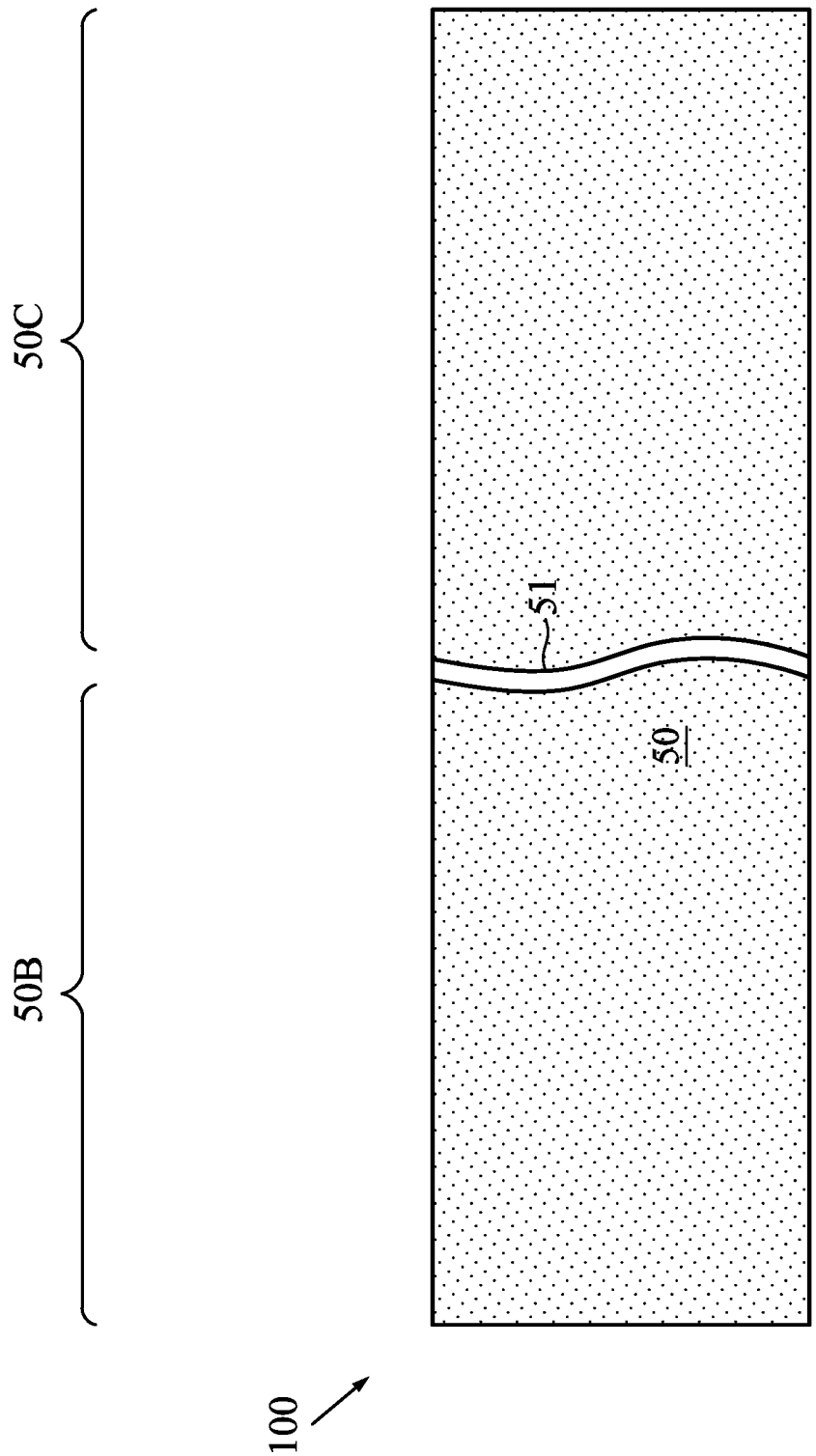
FIGS. 2-4 are cross sectional views of intermediate stages of the manufacture of a FinFET device in accordance with some embodiments.

FIGS. 2 through 6, and 11 through 28, depict steps in the formation of a FinFET device 100. In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a region 50B and a region 50C. The region 50B can be for forming n-type devices, such as NMOS transistors, e.g., n-type FinFETs. The region 50C can be for forming p-type devices, such as PMOS transistors, e.g., p-type FinFETs. The region 50B may be physically separated from the region 50C (as illustrated by divider 51), and any number of device features (e.g., other active devices, doped regions, isolation structures, etc.) may be disposed between the region 50B and the region 50C. In some embodiments, both the region 50B and the region 50C are used to form the same type of devices, such as both regions being for n-type devices or p-type devices.

Figure 3:
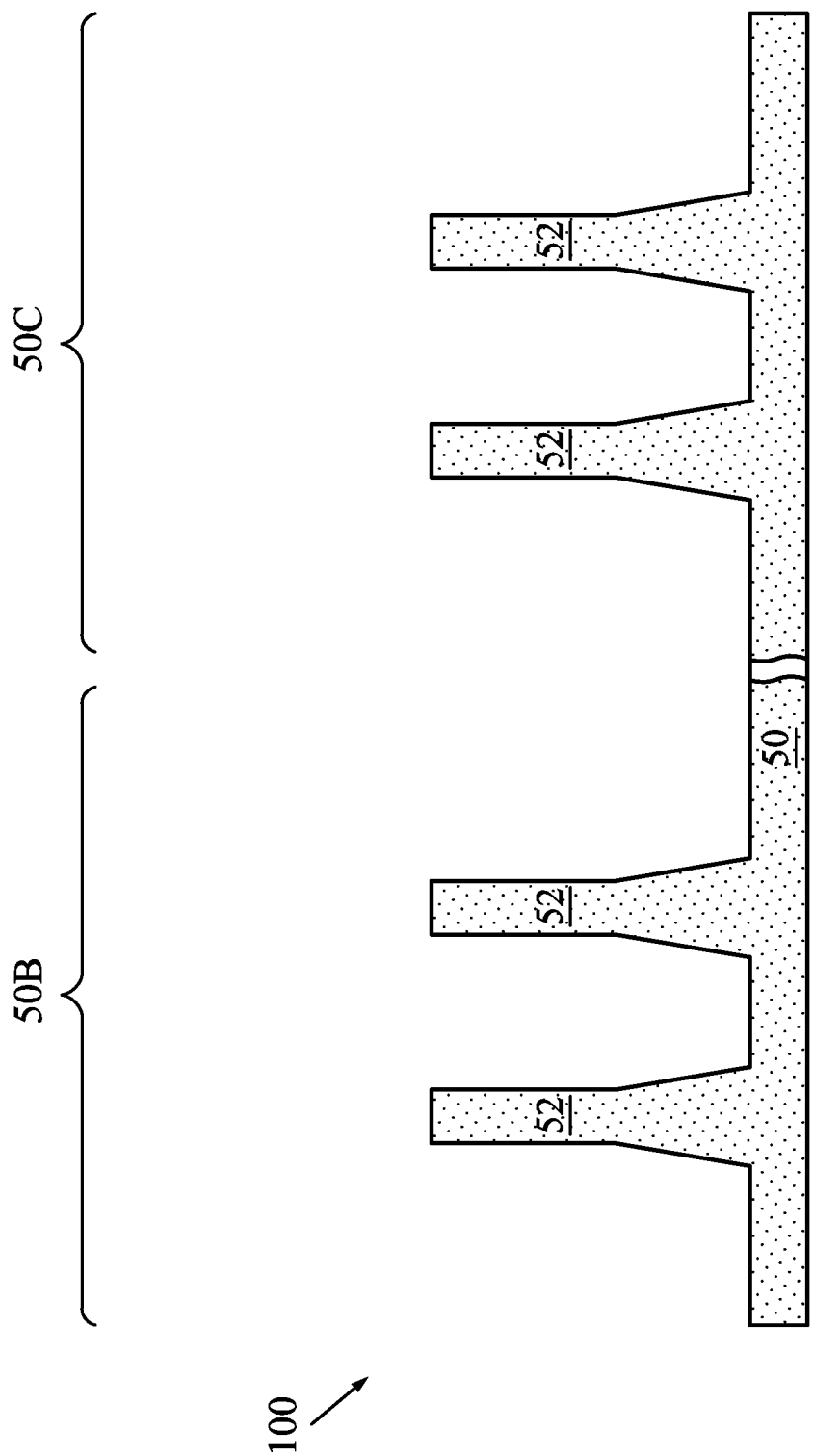

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins 52 may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 52.

Figure 4:
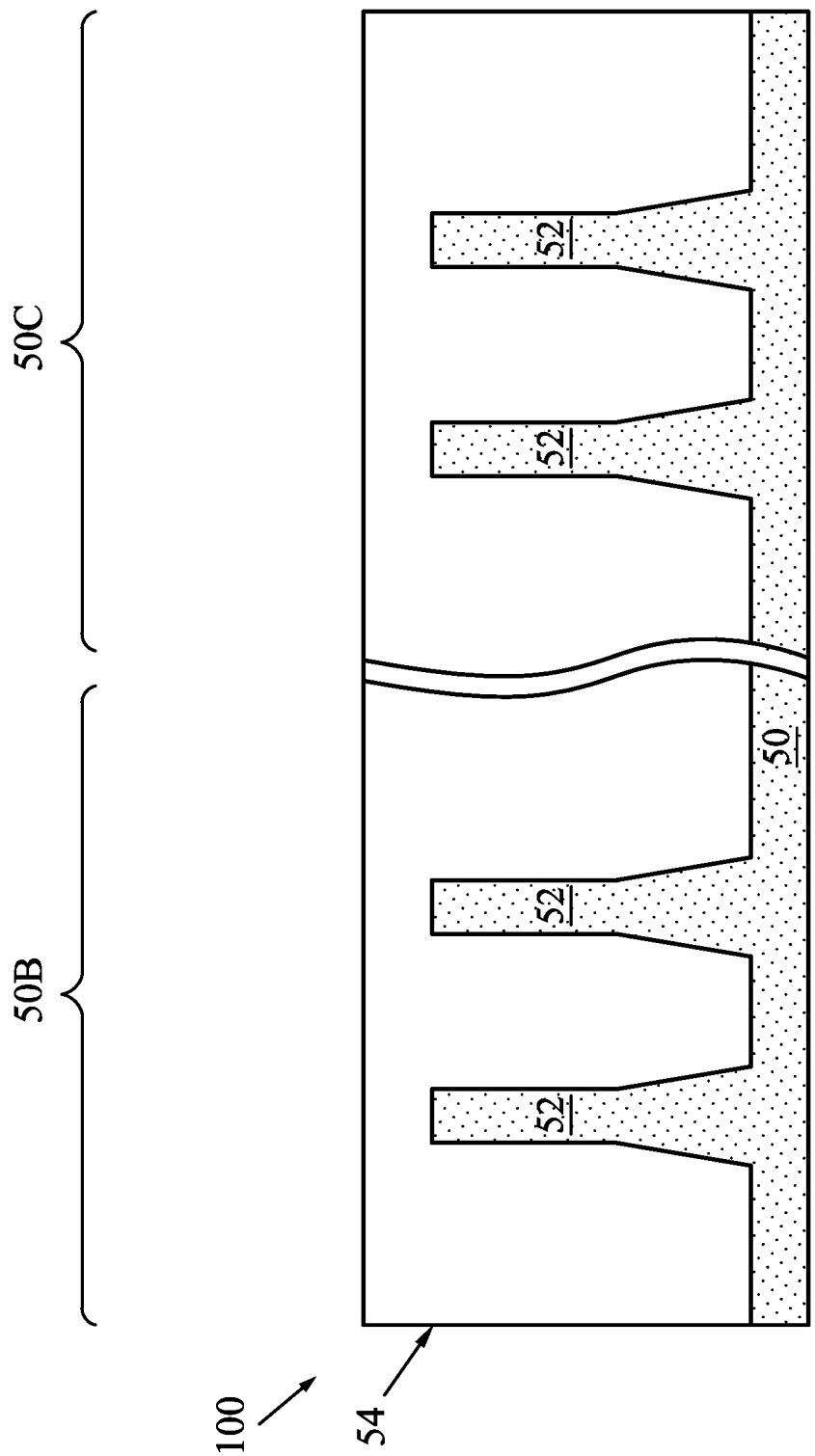

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD), or a combination thereof. Other insulation materials formed by any acceptable process may be used. In the illustrated embodiment, the insulation material 54 is silicon oxide formed by a FCVD process. In an embodiment, the insulation material 54 is formed such that excess insulation material 54 covers the fins 52.

In some embodiments, when insulation material 54 is formed using a FCVD process, a CVD-based material may be deposited using a remote plasma system. In some embodiments, the CVD-based material may include trisilylamine (TSA). Other suitable CVD-based materials may be used, such as precursors used to form nitride films, precursors used to form oxide films, or the like. A post curing conversion process may be used to make the CVD-based material convert to another material, such as an oxide. For example, molecules such as $NH_3$ and $O_2$ may be diffused into the TSA, causing a chemical reaction that creates an oxide, such as silicon oxide. In FIG. 4, during the conversion process, the diffusing molecules (e.g. $NH_3$ and $O_2$) are incident onto the surface of the insulation material 54 that is farthest from the substrate 5o, and diffuse into the insulation material 54 toward the substrate 50.

In some embodiments, the molecules that are diffused into the CVD-based material (e.g. the TSA) may not completely diffuse to all parts of the insulation material 54, and/or may not diffuse to at least some parts of the insulation material 54 in sufficient concentrations, resulting in incomplete film conversion. For example, the trenches between neighboring fins 52 may have a high aspect ratio, and the diffused molecules may not diffuse all the way to the bottom of the trenches, or may not diffuse into lower parts of the trenches in sufficient concentrations for complete film conversion. If the film conversion is incomplete, the resulting film may have high levels of impurities, and/or may be of lower quality. For example, an oxygen concentration of the oxide film may be lower, concentrations of impurities in the film may be higher, and an etch rate of the material may be higher than if the film converted more completely. In FIG. 4, insulation material 54 has more completely converted at a surface of insulation material 54 that is farthest from the substrate 50, and has incompletely converted in portions of the insulation material 54 that are between adjacent fins 52 and are proximate to substrate 50.

Figure 5:
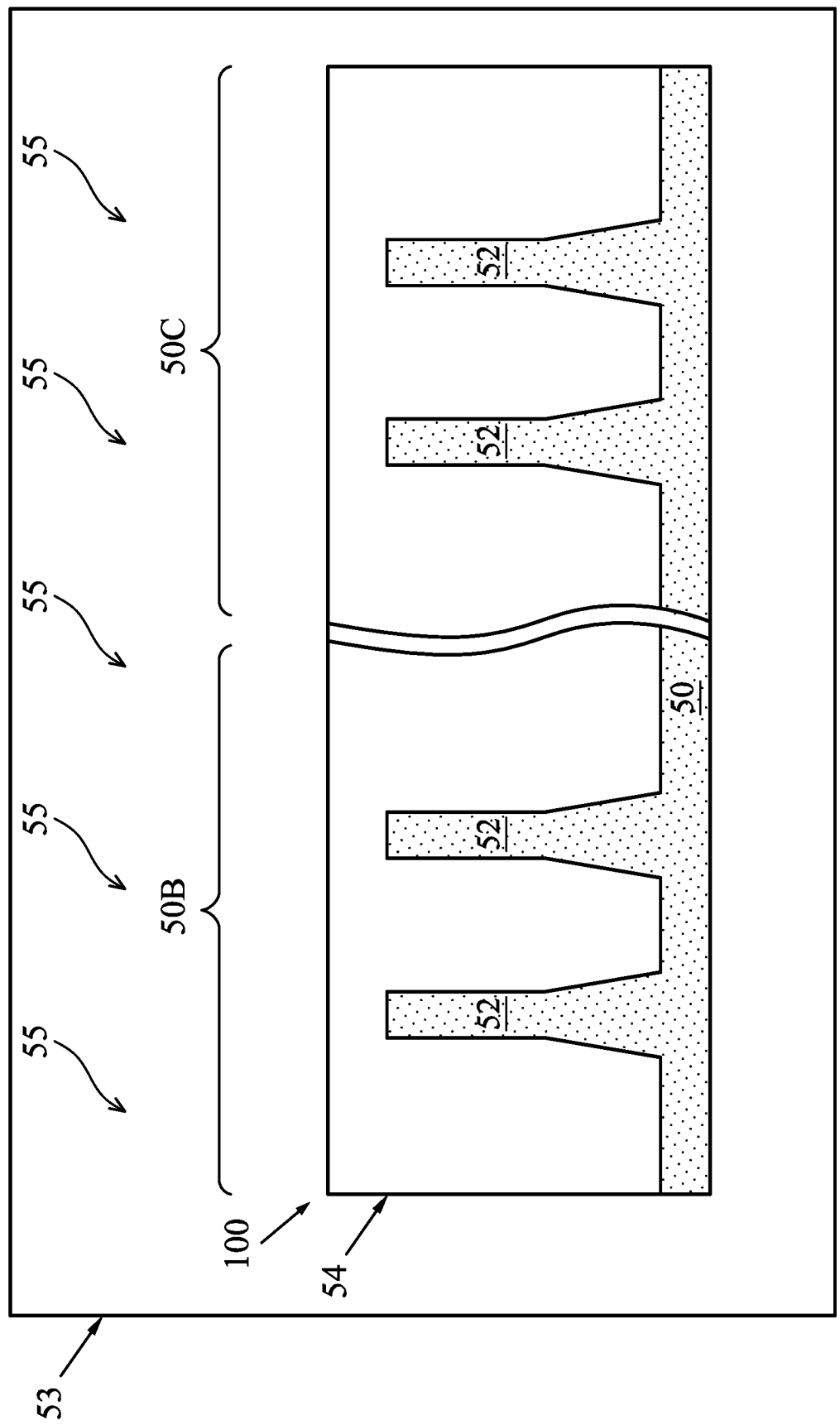
FIG. 5 depicts a FinFET device undergoing an anneal process in accordance with some embodiments.

In FIG. 5, a high pressure anneal process 55 is performed. In some embodiments, FinFET device 100 is placed in a process chamber 53 of a high pressure anneal processing device (see, e.g., FIG. 30 and the discussion below of FIG. 30), and the high pressure anneal process 55 is performed. In some embodiments, the high pressure anneal process 55 is a wet anneal process. High pressure steam is formed in the process chamber 53 at a desired pressure, and temperature of the process chamber 53 is raised to a desired temperature. The desired pressure and the desired temperature of the process chamber 53 are maintained in the process chamber 53 for a desired length of time. Hot water may be flowed into the process chamber 53 at a flow rate of about 1 standard liter per minute (SLM) to about 50 SLM to create the desired pressurized environment. In some embodiments, the desired pressure of the high pressure anneal process 55 may be greater than about 10 ATMs. The desired temperature of the high pressure anneal process 55 may be from about 200 C to about 500 C. The desired time of the high pressure anneal process 55 may be from about 20 minutes to about 3 hours.

Figure 6:
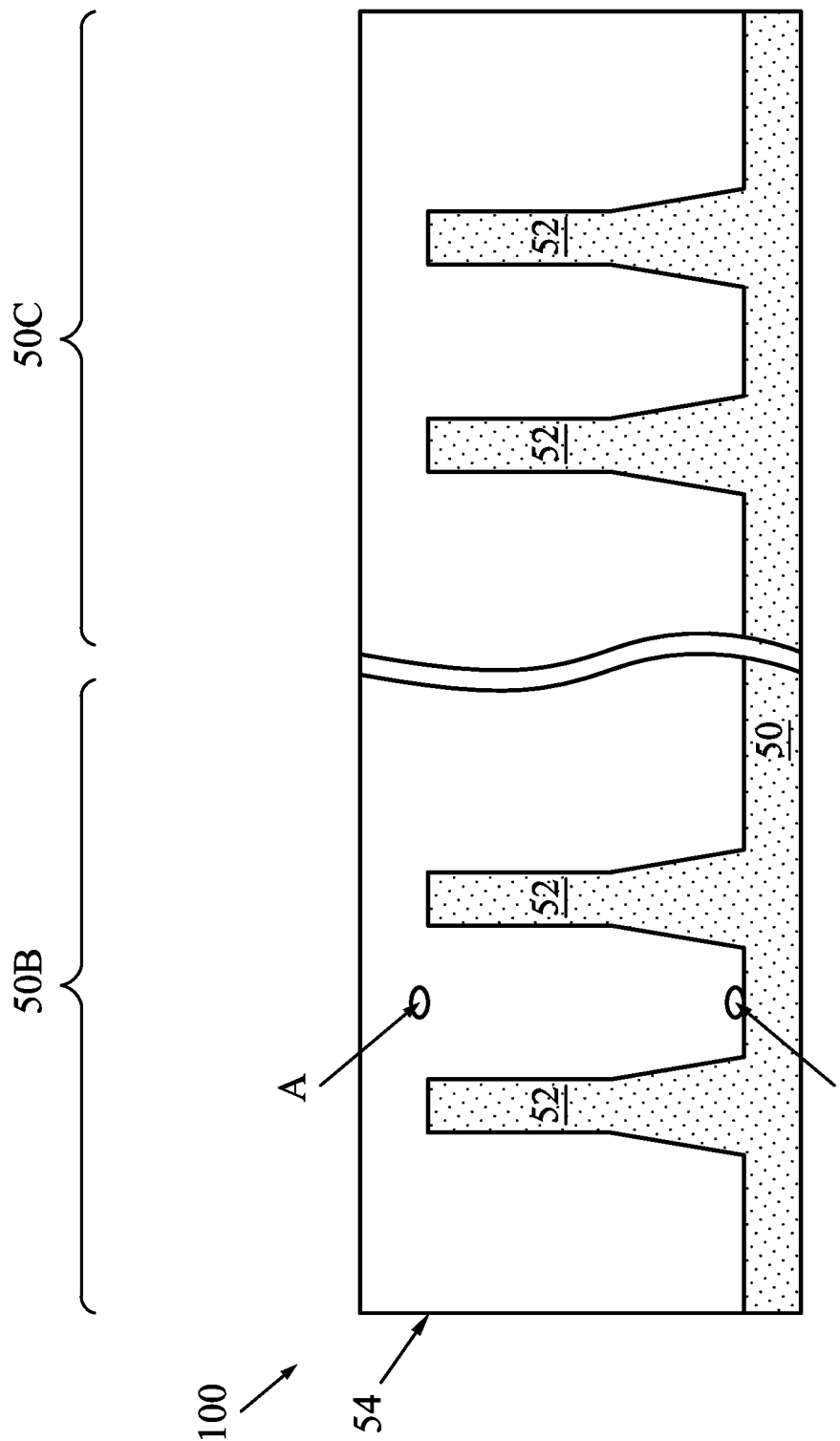
FIG. 6 is a cross sectional view of an intermediate stage of the manufacture of a FinFET device in accordance with some embodiments.

FIG. 6 depicts FinFET device 100 after the high pressure anneal process 55. In some embodiments, the high pressure anneal process 55 may cause the diffusing molecules to penetrate more deeply into the CVD-based material of insulation material 54, leading to a more complete film conversion. For example, compared to insulation material 54 prior to the high pressure anneal process 55, after the high pressure anneal process 55 the diffusing molecules have diffused deeper into insulation material 54, and/or have diffused in higher concentrations into at least some parts of insulation material 54, leading to a more complete film conversion. In some embodiments, portions of insulation material 54 proximate to substrate 50, and in trenches between adjacent fins 52, have more completely converted into an oxide (or have completely converted into an oxide).

Figure 7:
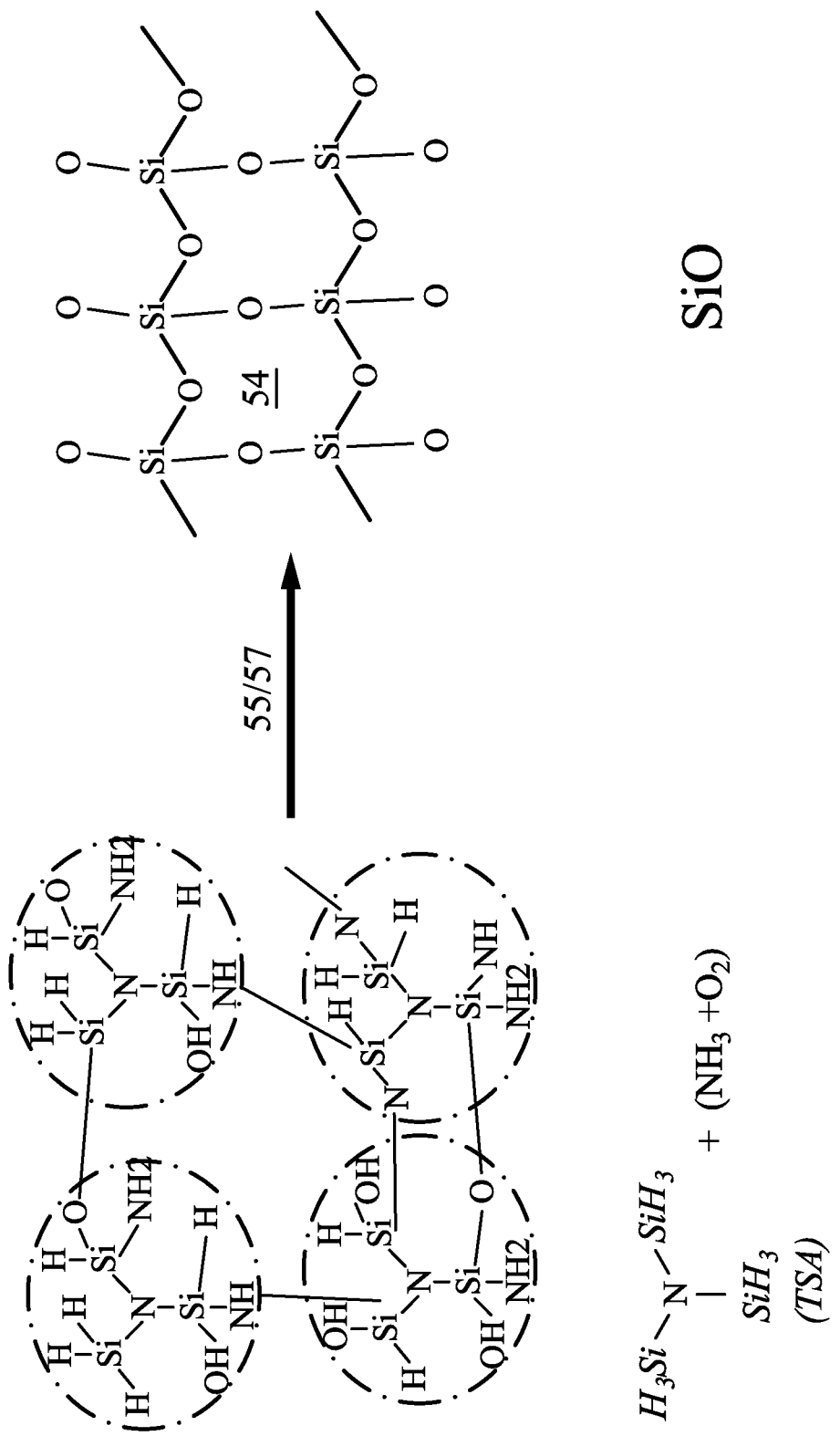
FIG. 7 is a diagram showing an example of molecular changes of a film that underwent an anneal process in accordance with some embodiments.

The high pressure anneal process 55 may result in insulation material 54 being a higher quality film. For example, the high pressure anneal process 55 may cause the resulting insulation material 54 to have lower concentrations of impurities. FIG. 7 shows an example of how the high pressure anneal process 55 may result in insulation material 54 being a higher quality film. The left side of FIG. 7 shows TSA molecules of insulation material 54 that have only partially converted into silicon oxide. For example, the TSA molecules have partially reacted with $NH_3$ and $O_2$ diffusing into the TSA, creating the partially converted molecules shown on the left. The incompletely converted TSA molecules include nitrogen and hydrogen impurities. The right side of FIG. 7 shows that the high pressure anneal process 55 has enabled the incompletely converted TSA molecules to more completely convert into silicon oxide, and the nitrogen and hydrogen impurities have been removed. In some embodiments, the high pressure anneal process 55 may cause a nitrogen concentration in the resulting film to have a concentration of $1e^{18}$ atoms/cm$^3$ or lower.

The high pressure anneal process 55 may also result in a higher quality film by lowering the wet etch rate of the insulation material 54. For example, by increasing the concentration of certain molecules in the insulation material 54 (e.g., oxygen), the wet etch rate to the resulting insulation material 54 may be lowered. In some embodiments, compared to an atmospheric pressure anneal process, high pressure anneal process 55 may cause the wet etch rate of the resulting film to be lowered by about 30% to about 50%. For example, in an embodiment the wet etch rate of the resulting film after an atmospheric pressure process may be about 70 Å/minute to about 200 Å/minute. After the high pressure anneal process 55, the wet etch rate of the resulting film may be about 50 Å/minute to about 120 Å/minute.

Figure 8:
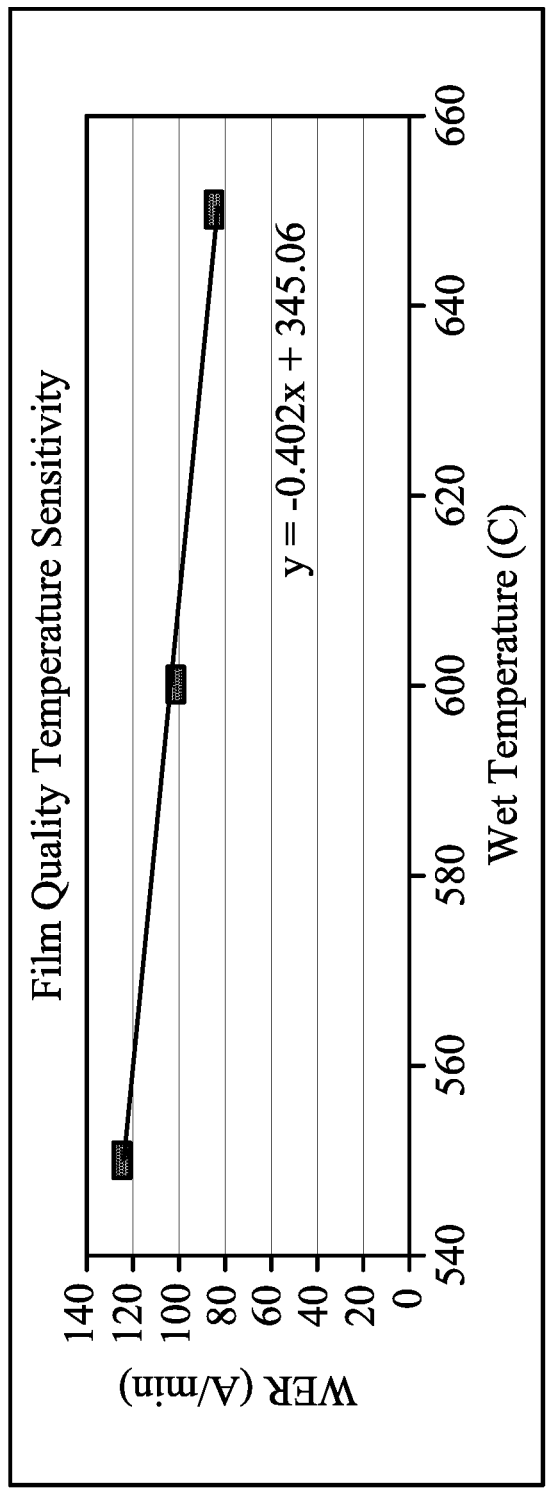
FIG. 8 is a chart showing a change in a wet etch rate versus etching temperature in accordance with some embodiments.

It is possible to lower the wet etch rate of a material by raising the temperature of the wet etch process. FIG. 8 shows an example of how a wet etch rate of a TSA film may be lowered by increasing a temperature of a wet etch process. However, as shown in FIG. 8, the temperature required for lowering the wet etch rate of the film may be relatively high. For example, the temperature required to lower the wet etch rate of the insulation material 54 to a desired point may be more that 550 C. By using high pressure anneal process 55, a wet etch rate of insulation material may be lowered to a desired point using a lower temperature than what would be required for a high temperature wet etch process. For example, high pressure anneal process 55 may be performed at temperatures of about 200 C to about 500 C, and may lower the wet etch rate of the insulation material 54 to a point that would have required a wet etch temperature of more than 550 C to achieve the same wet etch rate. In this manner, a thermal budget improvement may be achieved, and the need to raise the temperature of FinFET device more than 100 to a high temperature that could degrade the device is avoided.

Figure 9:
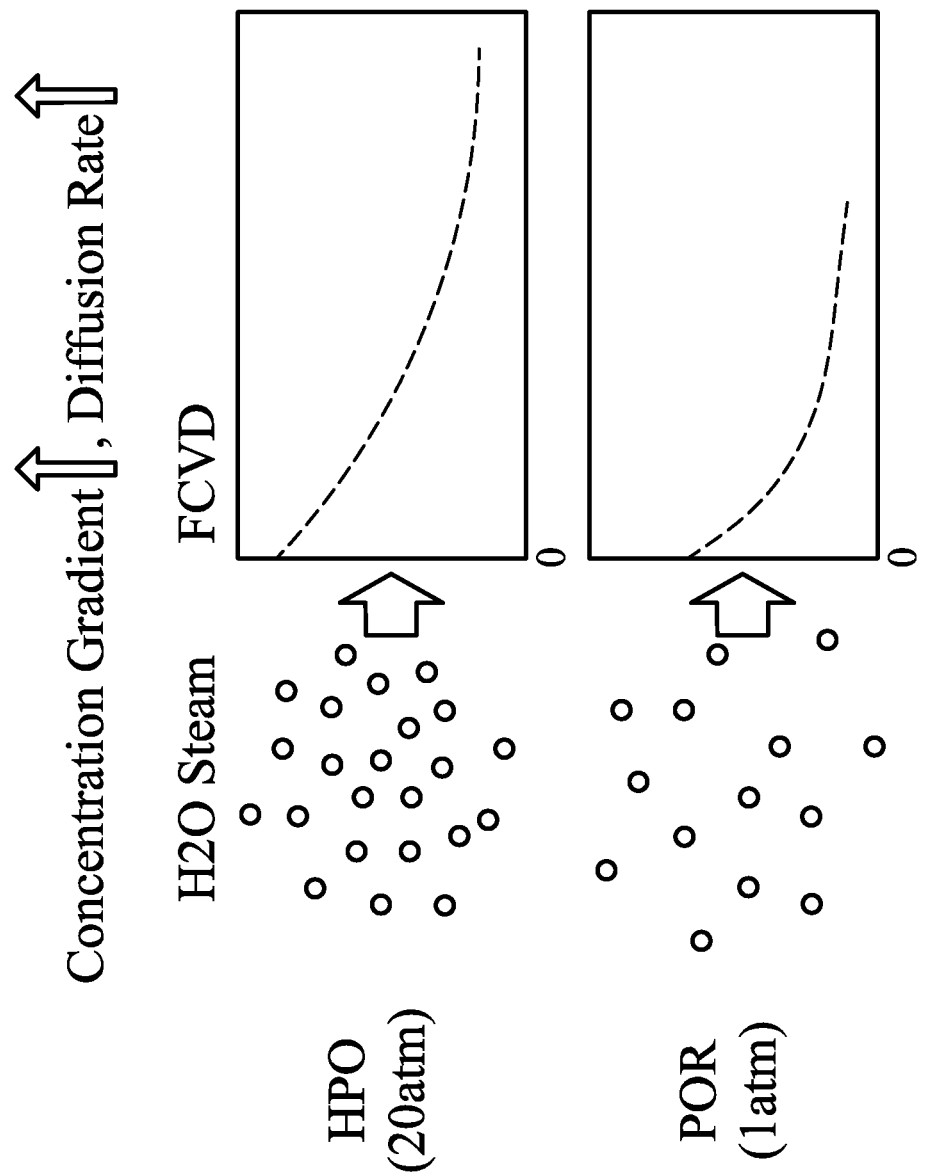
FIG. 9 is a chart showing a comparison of concentrations and diffusion rates of films that undergo different processing steps.

Some semiconductor formation processes may use an atmospheric pressure anneal process during the formation of the FCVD film. Compared to an atmospheric pressure anneal process, high pressure anneal process 55 may achieve better results. FIG. 9 shows a comparison of films formed using FCVD (e.g. insulation material 54) after a high pressure anneal process (e.g. high pressure anneal process 55) and after an atmospheric anneal process, respectively. In FIG. 9, wet high pressure anneal process 55 (designated as "HPO" in FIG. 9) was performed using an annealing pressure of 20 ATMs. A point of reference (POR) atmospheric pressure anneal process was also performed using an annealing pressure of 1 ATM. As shown in FIG. 9, the high pressure anneal process achieved superior results. A concentration gradient and a diffusing rate were improved in the film that underwent the high pressure anneal process. For example, the diffusing molecules (e.g. oxygen) diffused a greater distance into the film (e.g. TSA) that underwent the high pressure anneal process. At a given depth, the concentration of the diffusing molecule was greater in the film that underwent the high pressure anneal process. Further, by removing impurities in the film, a concentration gradient of the desired molecules was increased. Accordingly, high pressure anneal process 55 may achieve better results than an atmospheric anneal process.

As discussed above, high pressure anneal process 55 may yield better results than an atmospheric anneal process. For example, high pressure anneal process 55 may result in the same, similar, or better results as the atmospheric anneal process using a lower annealing temperature. As such, a thermal budget improvement may be realized. Additionally, undesirably high temperatures that may degrade FinFET device 100 may be reduced or avoided. Further, the lower temperature processing may enable insulation material to have a high density. For example, a film density of greater than about 2 g/cm$^3$ may be achieved. Compared to an atmospheric pressure anneal process, high pressure anneal process 55 may result in a 2 order improvement of film conversion. Further, compared to an atmospheric pressure anneal process, the diffusing molecules in high pressure anneal process 55 may realize a diffusion depth improvement of 10% to 50%. For example, the diffusing molecules may diffuse deeper into the CVD-based material, and higher concentrations of the diffusing molecules may be present at each depth of the CVD-based material. In some embodiments, raising the temperature of FinFET device 100 during an anneal process may cause oxidation of the silicon substrate. Compared to an atmospheric anneal process, oxidation of the film may be reduced by up to about 50% using the high pressure anneal process 55. For a same silicon loss amount (e.g. through oxidation), the high pressure anneal process 55 may achieve a better quality film than would be achieved using an atmospheric pressure anneal process.

Some semiconductor formation processes may use multiple atmospheric pressure anneal processes during the formation of the FCVD film to achieve a desired result. Compared to multiple atmospheric pressure anneal process, in some embodiments a single high pressure anneal process may be used to achieve the same, similar, or better results as the multiple atmospheric pressure anneal process. In this manner a lower thermal budget may be realized, and processing time may be reduced.

As described in detail above, different desired results and benefits may be achieved using the high pressure anneal processes described herein. Adjusting the parameters (e.g. pressure, temperature, time) of the high pressure anneal process may result in the ability to preferentially select particular results from the results described above. For example, by adjusting the time of the high pressure anneal process the quality of the resulting film may be adjusted. Similarly, a pressure of the high pressure anneal may be adjusted. For example, the diffusion depth and the concentration gradient of the film (e.g. insulation material 54) may be adjusted by adjusting the anneal pressure. In some embodiments, the pressure of the high pressure anneal processes may be adjusted between about 10 ATM and 25 ATM.

Figure 10:
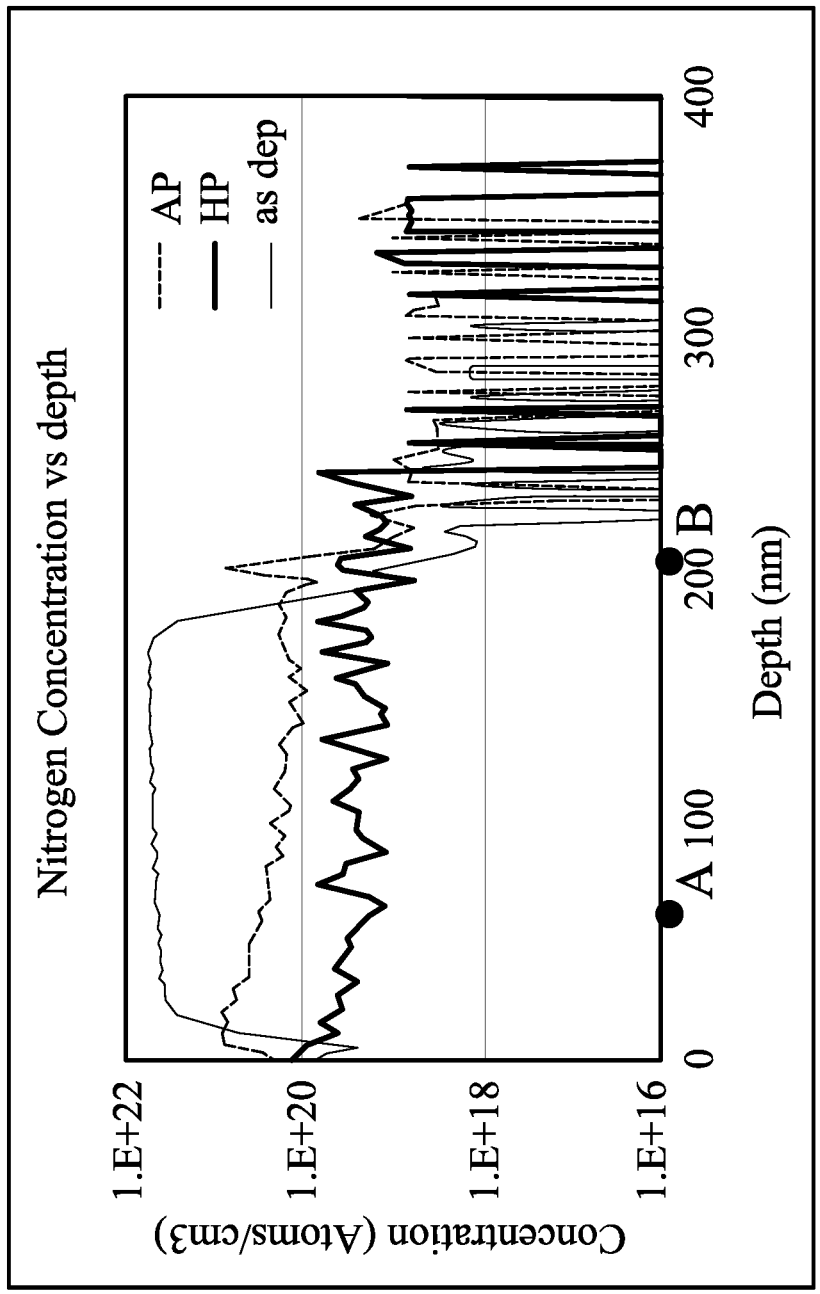
FIG. 10 is a chart showing nitrogen concentrations vs depth of FinFET devices that respectively undergo different processing steps.

In some embodiments, high pressure anneal process 55 reduces impurities in the film. FIG. 10 shows a concentration of nitrogen (an impurity in insulation material 54) versus depth of insulation material 54 for devices that respectively have undergone one of an atmospheric pressure (AP) anneal, a high pressure (HP) anneal, and no anneal ("as dep"). Point A and point B, shown on the depth axis in FIG. 10, correspond to points A and B shown in FIG. 6. As can be seen from FIG. 10, in the insulation material 54, a concentration of nitrogen between points A and B is lowest for the device that underwent the HP anneal. The concentration of nitrogen is less than $1e^{22}$ atoms/cm$^3$ throughout the insulation material 54. In some embodiments, the high pressure anneal process 55 may cause a nitrogen concentration in the resulting film to have a concentration of $1e^{18}$ atoms/cm$^3$ or lower.

Figure 11:
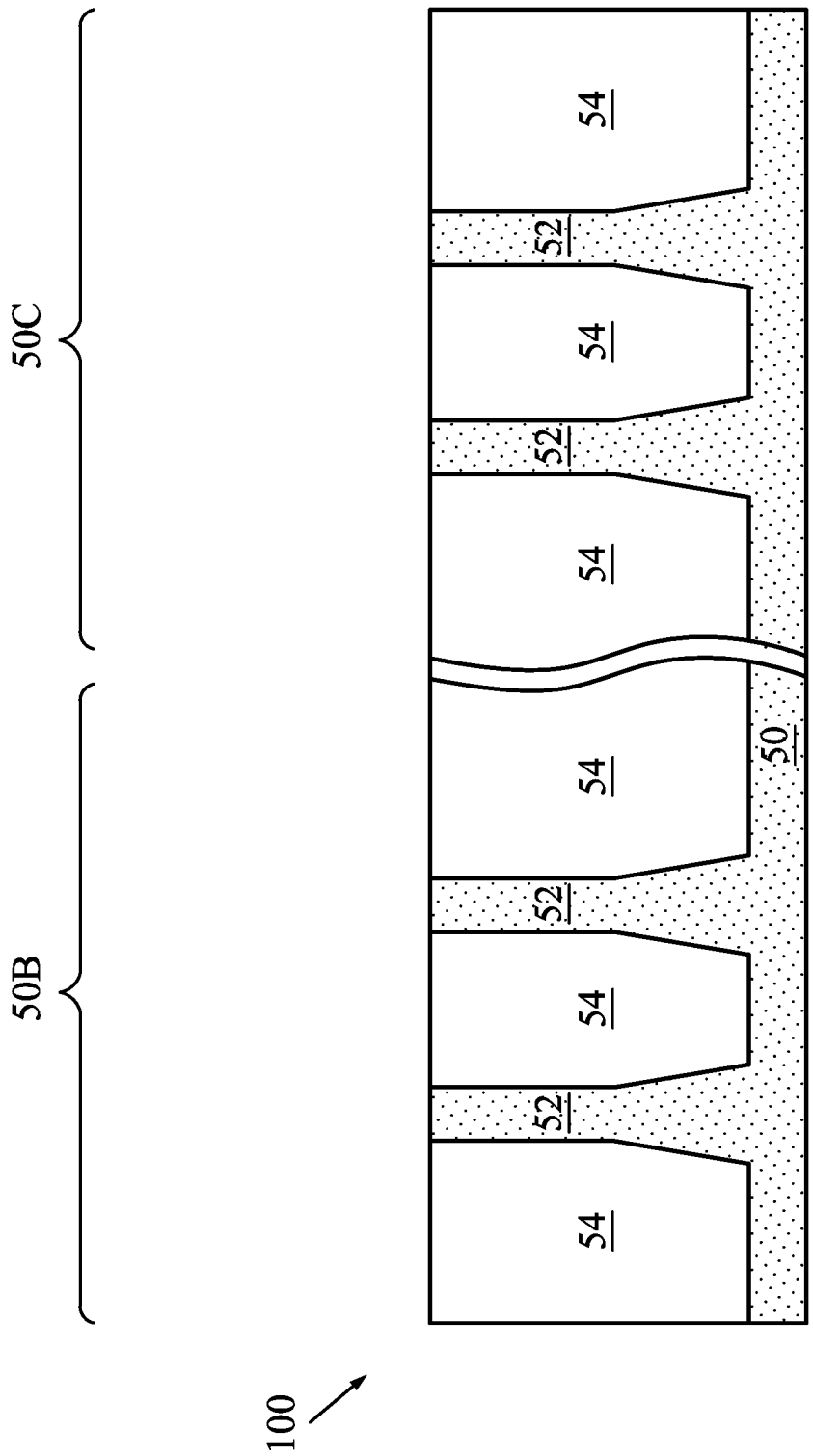

In FIG. 11, a planarization process is applied to the insulation material 54. In some embodiments, the planarization process includes a chemical mechanical polish (CMP), an etch back process, combinations thereof, or the like. The planarization process may expose the fins 52. In embodiments in which the planarization processes exposes the fins 52, top surfaces of the fins 52 and the insulation material 54 may be level after the planarization process is complete. In some other embodiments, a metal pad (not shown) and/or a mask layer (not shown) may be disposed along the top surfaces of fins 52. In this case, the planarization process may expose the metal pad or the mask layer, and after the planarization process is complete the insulation material 54 may be level with the top surfaces of the expose the metal pad or the mask layer.

Figure 12:
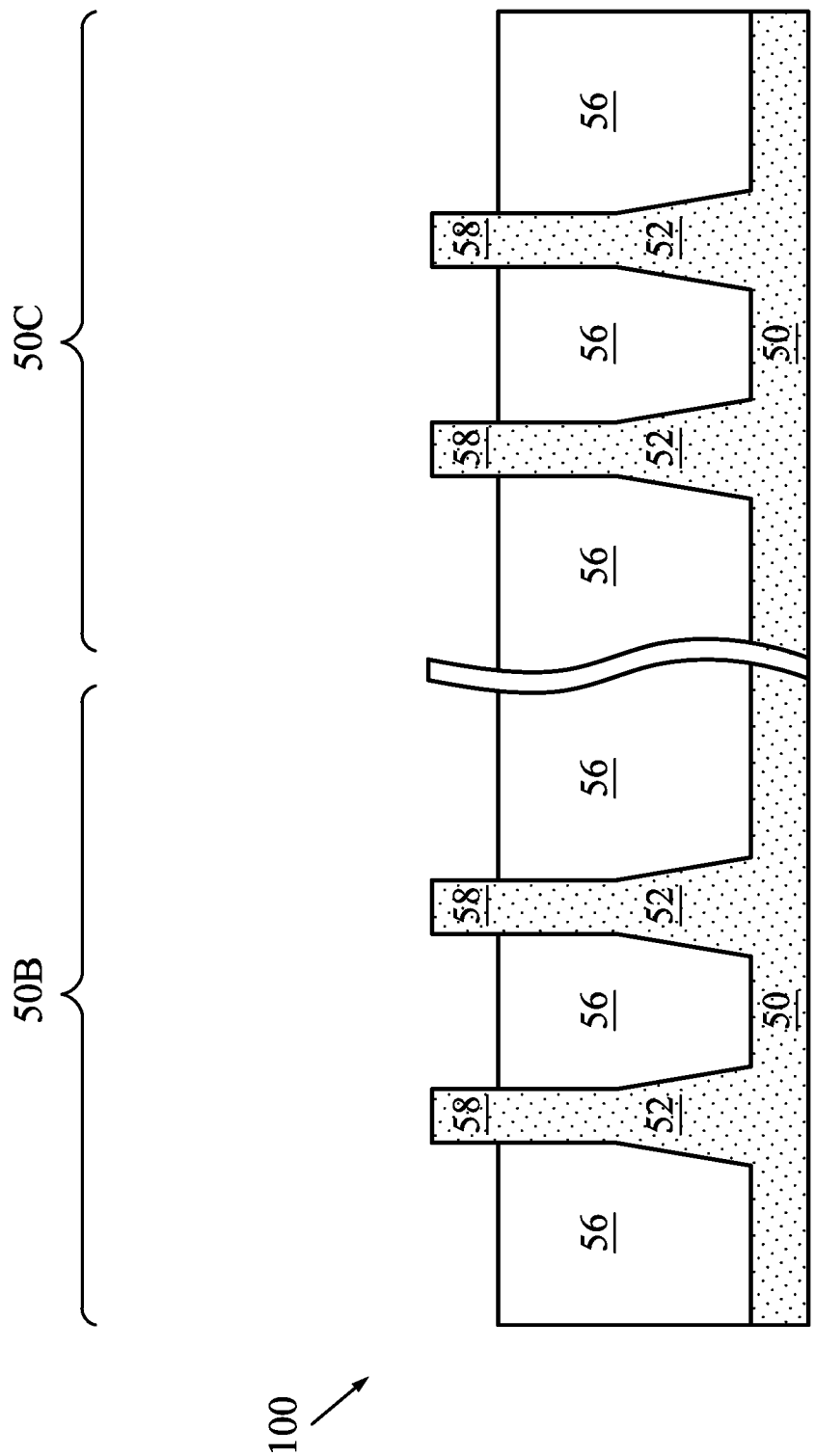

In FIG. 12, the insulation material 54 (shown in FIG. 11) is recessed to form Shallow Trench Isolation (STI) regions 56. The insulation material 54 is recessed such that fins 58 in the region 50B and in the region 50C protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54. For example, a chemical oxide removal using a CERTAS® etch or an Applied Materials SICONI tool or dilute hydrofluoric (dHF) acid may be used.

Further in FIG. 12, appropriate wells (not shown) may be formed in the fins 58, the fins 52, and/or the substrate 50. In some embodiments, a P well may be formed in the region 50B, and an N well may be formed in the region 50C. In some embodiments, a P well or an N well are formed in both the region 50B and the region 50C.

In the embodiments with different well types, the different implant steps for the region 50B and the region 50C may be achieved using a photoresist or other masks (not shown). For example, a photoresist may be formed over the fins 58 and the STI regions 56 in the region 50B. The photoresist is patterned to expose the region 50C of the substrate 50, such as a PMOS region. The photoresist can be formed by using a spin-on technique and can be patterned using acceptable photolithography techniques. Once the photoresist is patterned, an n-type impurity implant is performed in the region 50C, and the photoresist may act as a mask to substantially prevent n-type impurities from being implanted into the region 50B, such as an NMOS region. The n-type impurities may be phosphorus, arsenic, or the like implanted in the region to a concentration of equal to or less than $10^{18}$ cm$^{-3}$, such as between about $10^{17}$ cm$^{-3}$ and about $10^{18}$ cm$^{-3}$. After the implant, the photoresist is removed, such as by an acceptable ashing process.

Following the implanting of the region 50C, a photoresist is formed over the fins 58 and the STI regions 56 in the region 50C. The photoresist is patterned to expose the region 50B of the substrate 50, such as the NMOS region. The photoresist can be formed by using a spin-on technique and can be patterned using acceptable photolithography techniques. Once the photoresist is patterned, a p-type impurity implant may be performed in the region 50B, and the photoresist may act as a mask to substantially prevent p-type impurities from being implanted into the region 50C, such as the PMOS region. The p-type impurities may be boron, $BF_2$, or the like implanted in the region to a concentration of equal to or less than $10^{18}$ cm$^{-3}$, such as between about $10^{17}$ cm$^{-3}$ and about $10^{18}$ cm$^{-3}$. After the implant, the photoresist may be removed, such as by an acceptable ashing process.

After the implants of the region 50B and the region 50C, an anneal may be performed to activate the p-type and/or n-type impurities that were implanted. In some embodiments, the grown materials of epitaxial fins may be in situ doped during growth, which may obviate the implantations, although in situ and implantation doping may be used together.

Figure 13:
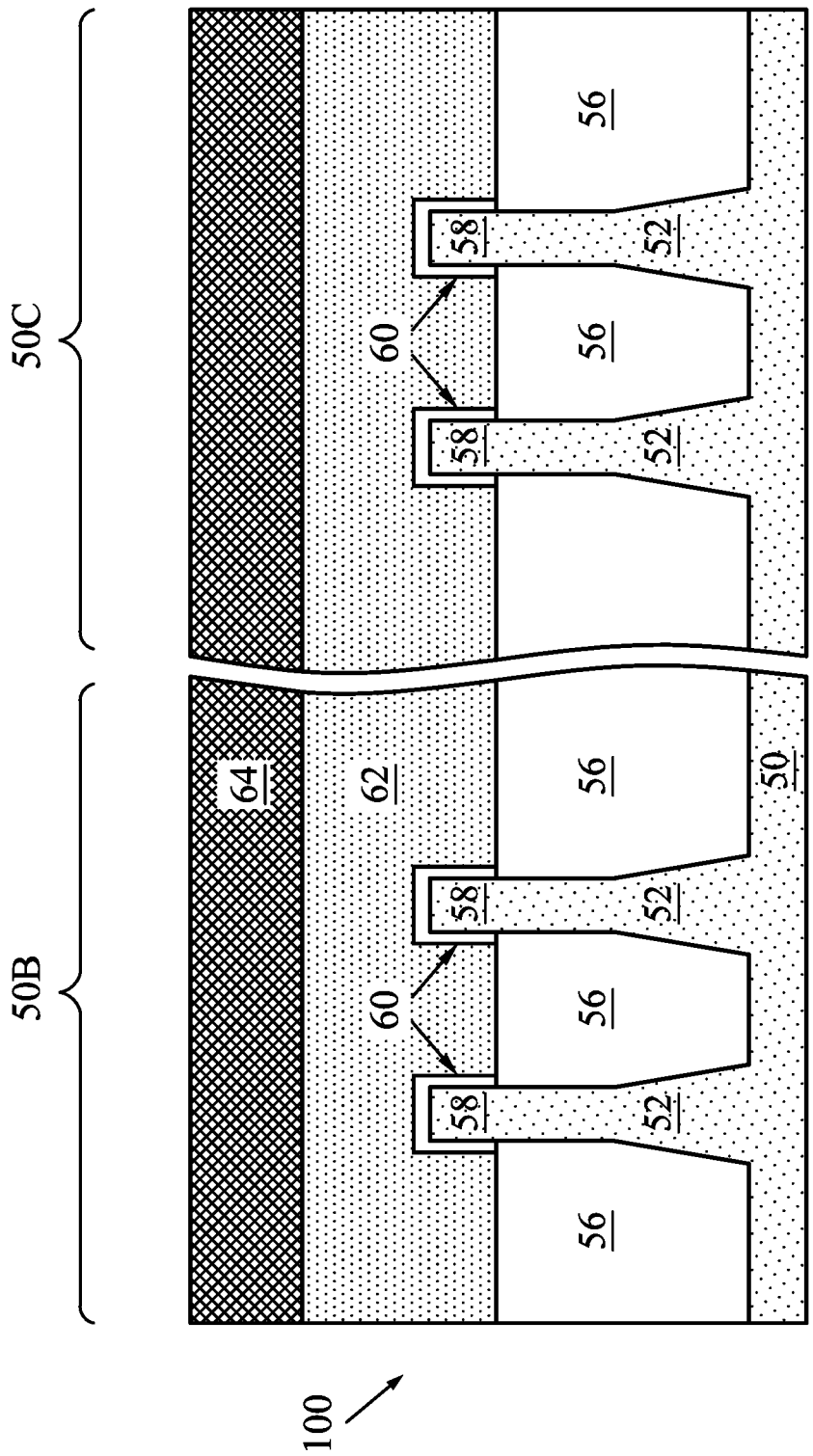

In FIG. 13, a dummy dielectric layer 60 is formed on the fins 58. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP process. The mask layer 64 may be deposited over the dummy gate layer 62. The dummy gate layer 62 may be a conductive material and may be selected from a group including polycrystalline-silicon (polysilicon), poly-crystalline silicon-germanium (poly-SiGe), metallic nitrides, metallic silicides, metallic oxides, and metals. In one embodiment, amorphous silicon is deposited and recrystallized to create polysilicon. The dummy gate layer 62 may be deposited by physical vapor deposition (PVD), CVD, sputter deposition, or other techniques known and used in the art for depositing conductive materials. The dummy gate layer 62 may be made of other materials that have a high etching selectivity from the etching of isolation regions. The mask layer 64 may include, for example, SiN, SiON, or the like. In this example, a single dummy gate layer 62 and a single mask layer 64 are formed across the region 50B and the region 50C. In some embodiments, separate dummy gate layers may be formed in the region 50B and the region 50C, and separate mask layers may be formed in the region 50B and the region 50C.

FIGS. 14A through 28 illustrate various additional steps in the manufacturing of embodiment devices. FIGS. 14A through 28 illustrate features in either of the region 50B and the region 50C. For example, the structures illustrated in FIGS. 14A through 28 may be applicable to both the region 50B and the region 50C. Differences (if any) in the structures of the region 50B and the region 50C are described in the text accompanying each figure.

Figure 14B:
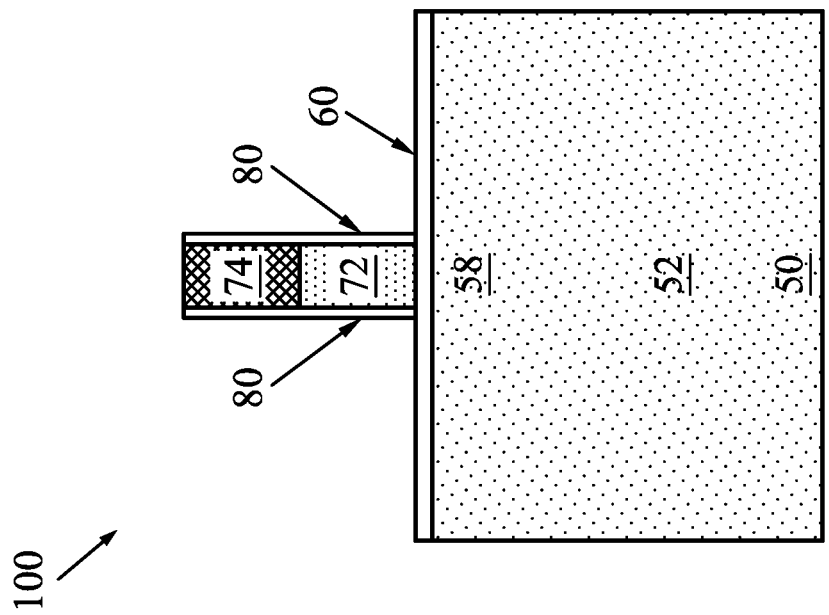
Figure 14A:
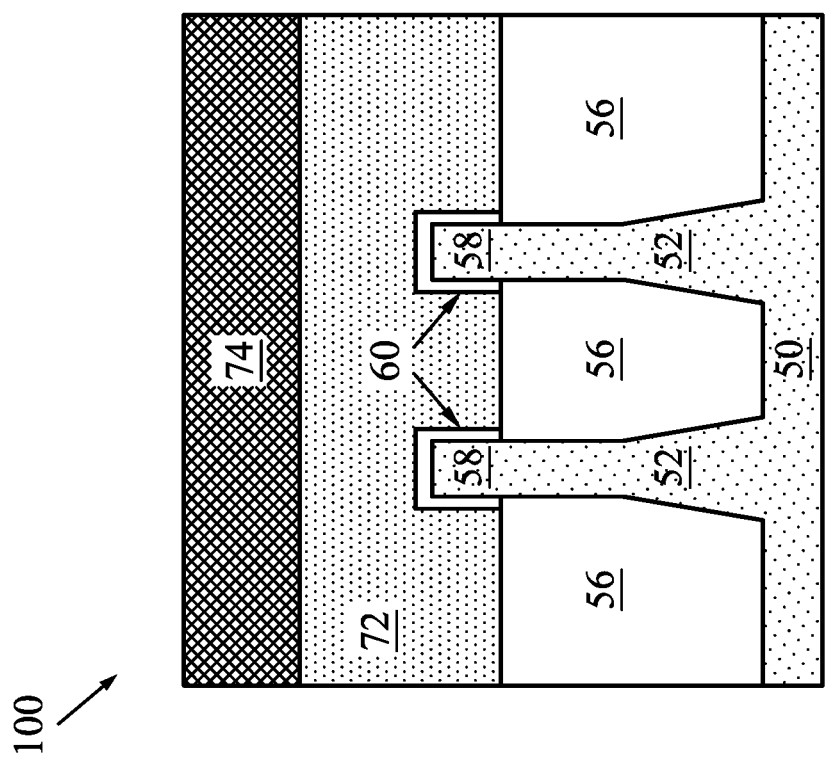

In FIGS. 14A and 14B, the mask layer 64 may be patterned using acceptable photolithography and etching techniques to form masks 74. The pattern of the masks 74 then may be transferred to the dummy gate layer 62 and the dummy dielectric layer 60 by an acceptable etching technique to form dummy gates 72. The dummy gates 72 cover respective channel regions of the fins 58. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52/58.

Further in FIGS. 14A and 14B, gate seal spacers 80 can be formed on exposed surfaces of the dummy gates 72, and/or the masks 74, and on the fins 58 or the dummy dielectric layer 60. A thermal oxidation or a deposition followed by an anisotropic etch may form the gate seal spacers 80.

After the formation of the gate seal spacers 80, implants for lightly doped source/drain (LDD) regions (not explicitly illustrated) may be performed. In the embodiments with different device types, similar to the implants discussed above in FIG. 12, a mask, such as a photoresist, may be formed over the region 50B, while exposing the region 50C, and appropriate type (e.g., n-type or p-type) impurities may be implanted into the exposed fins 58 in the region 50C. The mask may then be removed. Subsequently, a mask, such as a photoresist, may be formed over the region 50C while exposing the region 50B, and appropriate type impurities may be implanted into the exposed fins 58 in the region 50B. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{16}$ cm$^{-3}$. An anneal may be used to activate the implanted impurities.

In FIGS. 15A and 15B, gate spacers 86 are formed on the gate seal spacers 80 along sidewalls of the dummy gates 72 and the masks 74. The gate spacers 86 may be formed by conformally depositing a material and subsequently anisotropically etching the material. The material of the gate spacers 86 may be silicon nitride, SiCN, a combination thereof, or the like.

Figure 16B:
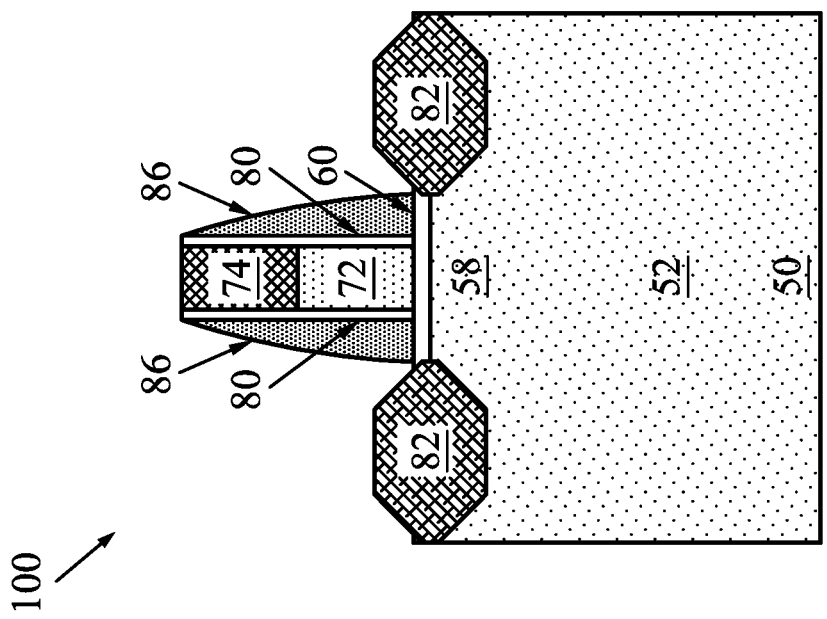
Figure 16A:
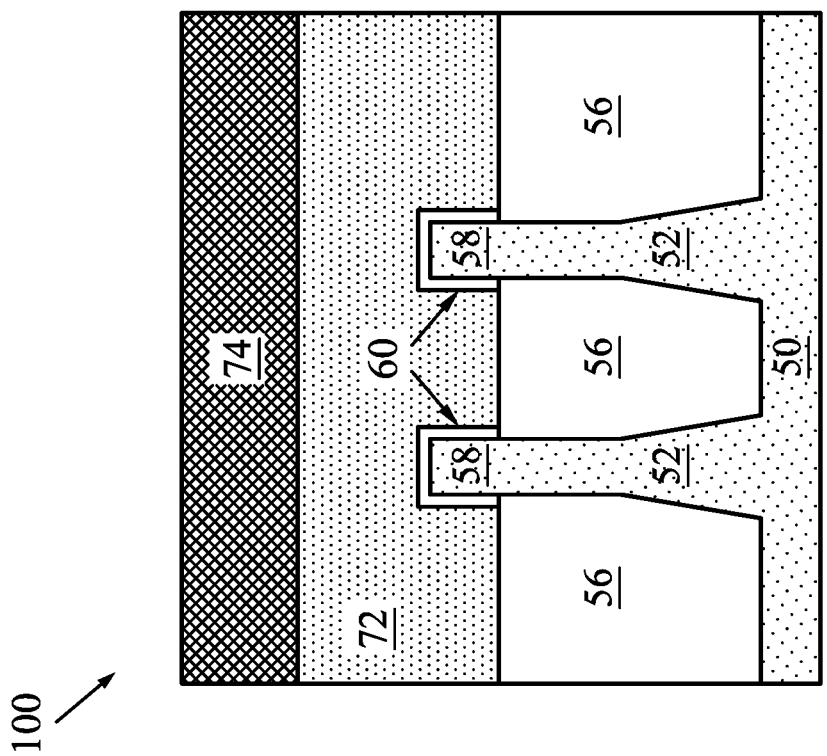

In FIGS. 16A and 16B epitaxial source/drain regions 82 are formed in the fins 58. The epitaxial source/drain regions 82 are formed in the fins 58 such that each dummy gate 72 is disposed between respective neighboring pairs of the epitaxial source/drain regions 82. In some embodiments epitaxial source/drain regions 82 may extend into the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs.

The epitaxial source/drain regions 82 in the region 50B, e.g., the NMOS region, may be formed by masking the region 50C, e.g., the PMOS region, and etching source/drain regions of the fins 58 in the region 50B form recesses in the fins 58. Then, the epitaxial source/drain regions 82 in the region 50B are epitaxially grown in the recesses. The epitaxial source/drain regions 82 may include any acceptable material, such as appropriate for n-type FinFETs. For example, if the fin 58 is silicon, the epitaxial source/drain regions 82 in the region 50B may include silicon, SiC, SiCP, SiP, or the like. The epitaxial source/drain regions 82 in the region 50B may have surfaces raised from respective surfaces of the fins 58 and may have facets.

The epitaxial source/drain regions 82 in the region 50C, e.g., the PMOS region, may be formed by masking the region 50B, e.g., the NMOS region, and etching source/drain regions of the fins 58 in the region 50C are etched to form recesses in the fins 58. Then, the epitaxial source/drain regions 82 in the region 50C are epitaxially grown in the recesses. The epitaxial source/drain regions 82 may include any acceptable material, such as appropriate for p-type FinFETs. For example, if the fin 58 is silicon, the epitaxial source/drain regions 82 in the region 50C may comprise SiGe, SiGeB, Ge, GeSn, or the like. The epitaxial source/drain regions 82 in the region 50C may also have surfaces raised from respective surfaces of the fins 58 and may have facets.

The epitaxial source/drain regions 82 and/or the fins 58 may be implanted with dopants to form source/drain regions, similar to the process previously discussed for forming lightly doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

Figure 16C:
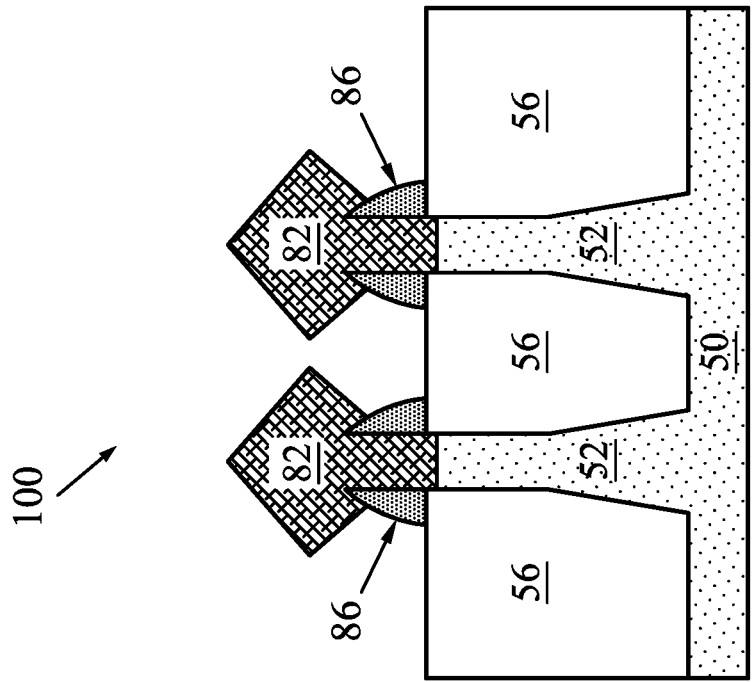
Figure 16D:
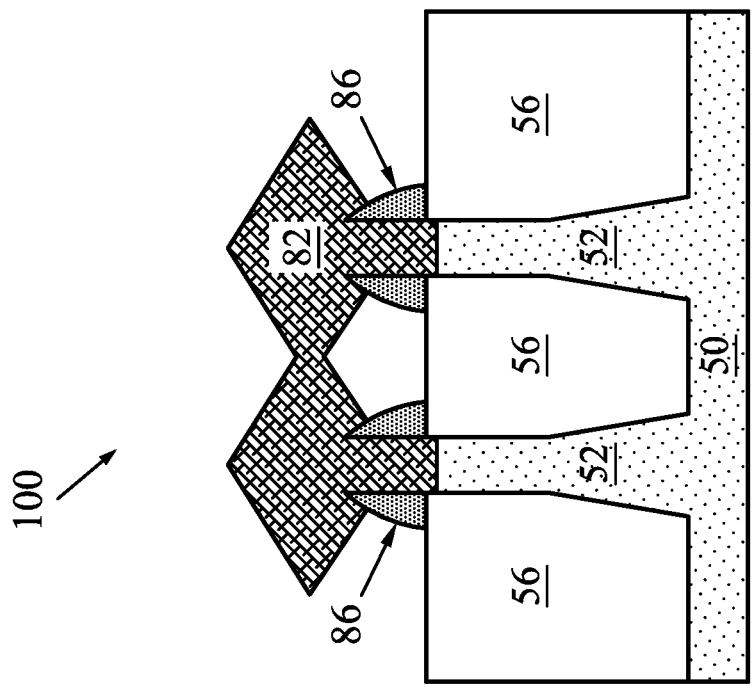

As a result of the epitaxy processes used to form the epitaxial source/drain regions 82 in the region 50B and the region 50C, upper surfaces of the epitaxial source/drain regions have facets which expand laterally outward beyond a sidewalls of the fins 58. In some embodiments, these facets cause adjacent source/drain regions 82 of a same FinFET to merge as illustrated by FIG. 16C. In other embodiments, adjacent source/drain regions 82 remain separated after the epitaxy process is completed as illustrated by FIG. 16D.

Figure 17B:
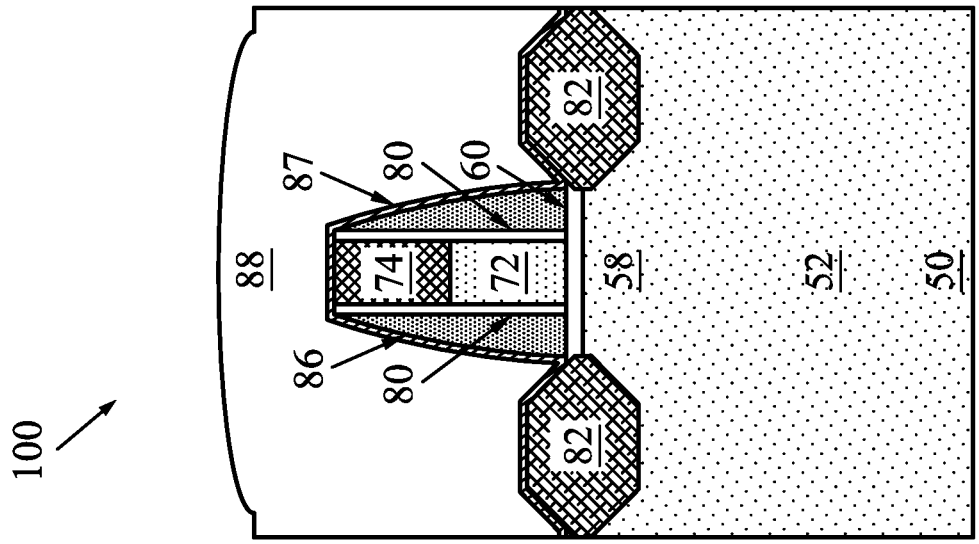
Figure 17A:
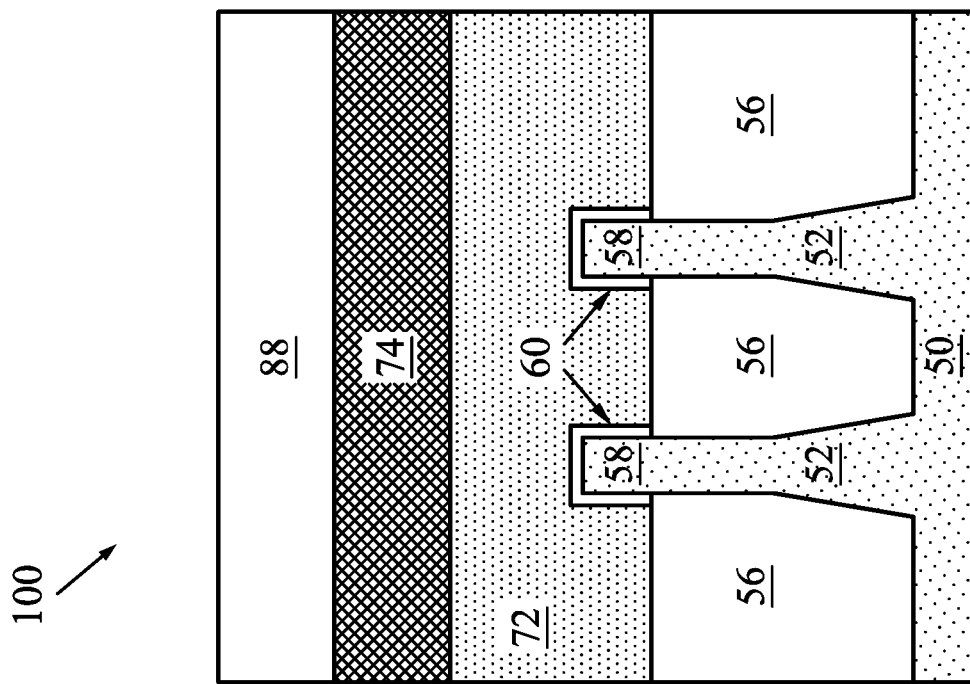
Figure 17C:
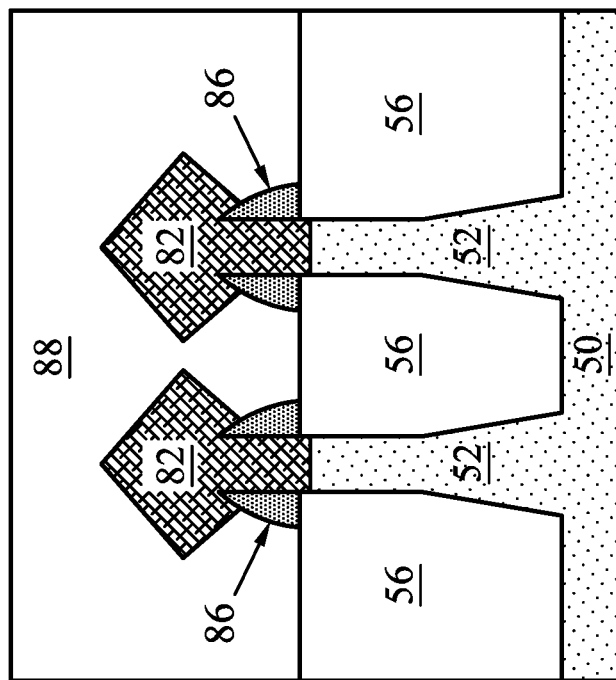
Figure 18:
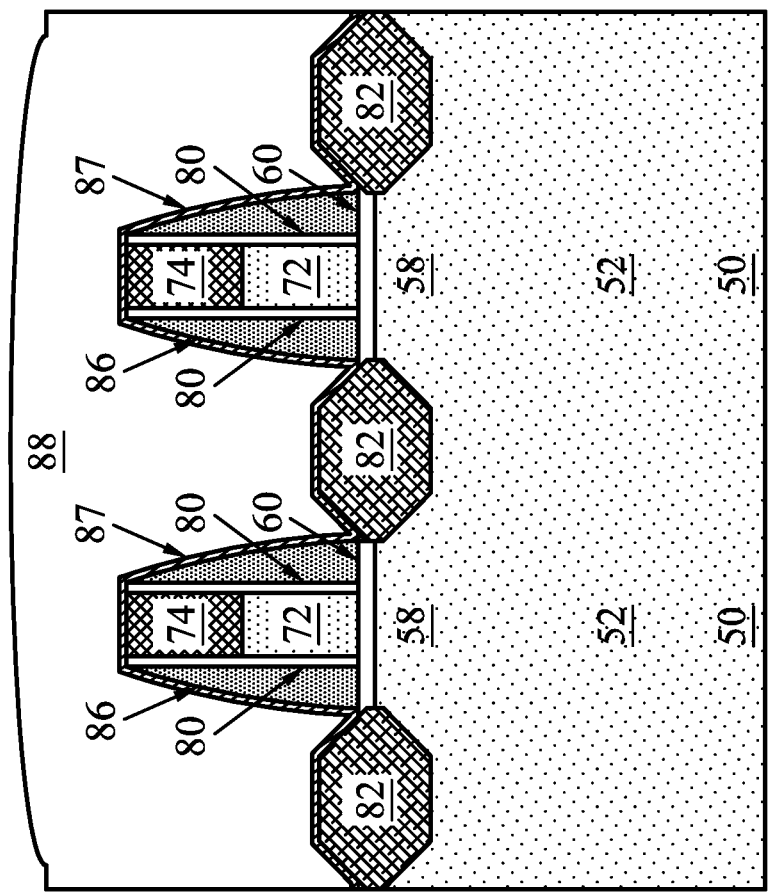
Figure 20B:
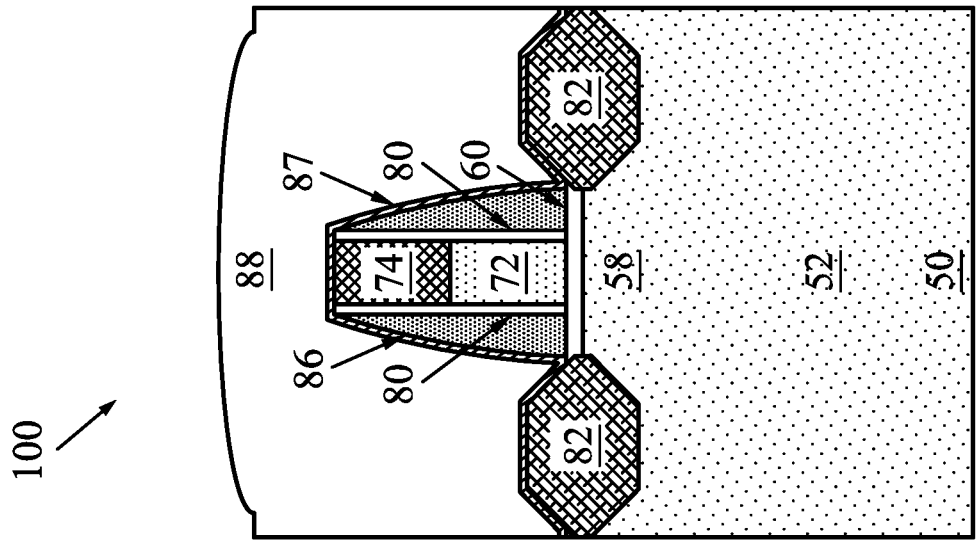
Figure 20A:
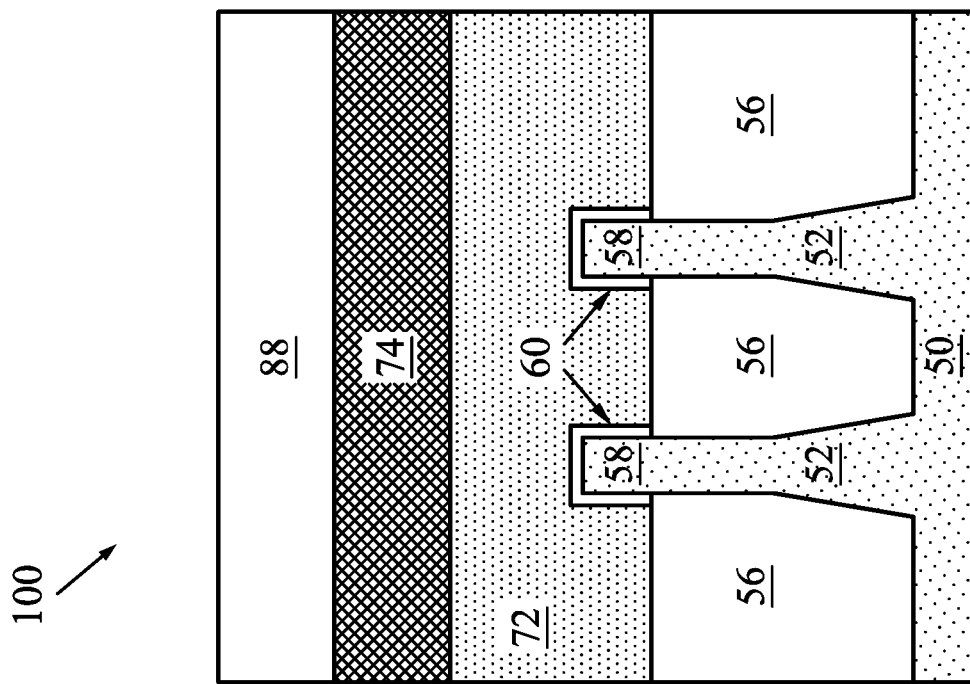
Figure 20C:
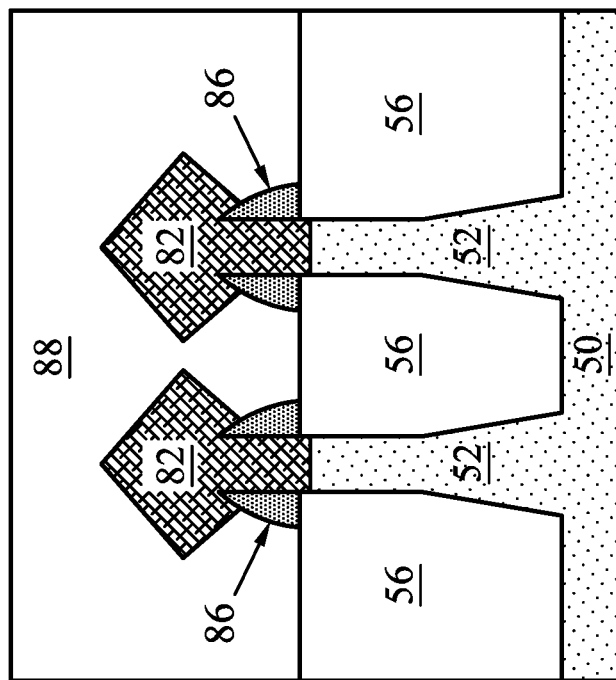

In FIGS. 17A, 17B, and 17C, an ILD 88 is deposited over the structure illustrated in FIGS. 16A-16D. The ILD 88 may be formed of a dielectric material or a semiconductor material, and may be deposited by any suitable method, such as CVD, plasma-enhanced CVD (PECVD), or FCVD. Dielectric materials may include Phospho-Silicate Glass (PSG), Boro-Silicate Glass (BSG), Boron-Doped Phospho-Silicate Glass (BPSG), undoped Silicate Glass (USG), or the like. Semiconductor materials may include amorphous silicon, silicon germanium ($Si_xGe_{1-x}$, where x can be between approximately 0 and 1), pure Germanium, or the like. In some embodiments oxide or nitride films may be used. Other insulation or semiconductor materials formed by any acceptable process may be used. In some embodiments, a contact etch stop layer (CESL) 87 is disposed between the ILD 88 and the epitaxial source/drain regions 82, the hard mask 74, and the gate spacers 86. The CESL 87 may comprise a dielectric material, such as, silicon nitride, silicon oxide, silicon ox nitride, or the like.

The embodiment shown in FIGS. 17A-17C depicts ILD 88 being formed using an FCVD process. As discussed above in connection with FIGS. 4-10, in the FCVD process, a CVD-based material may be deposited using a remote plasma system. In some embodiments, the CVD-based material may include TSA. Other suitable CVD-based materials may be used. A post curing process may be used to make the CVD-based convert to another material, such as an oxide or a nitride. For example, molecules such as $NH_3$ and $O_2$, may be diffused into the TSA, causing a chemical reaction that creates an oxide, such as silicon oxide. In FIGS. 17A-C, the diffusing molecules (e.g. $NH_3$ and $O_2$) are incident onto the surface of the ILD 88 that is farthest from the substrate 50, and diffuse into the ILD 88 toward the substrate 50.

In some embodiments, the materials that are diffused into the CVD-based material (e.g. the TSA) of ILD 88 may not completely diffuse to all parts of the ILD 88, and/or may not diffuse to at least some parts of the ILD 88 in sufficient concentrations, resulting in incomplete film conversion. For example, ILD 88 may not be completely converted along the source/drain regions 82. In some embodiments, the trenches between neighboring source drain regions 82 (see, e.g., FIG. 17C) may have a high aspect ratio, and the diffused molecules may not diffuse all the way to the bottom of the trenches, or may not diffuse into lower parts of the trenches in sufficient concentrations for complete film conversion. In some embodiments, trenches between neighboring dummy gates 72 (shown in FIG. 18) may have a high aspect ratio, and the diffused molecules may not diffuse all the way to the bottom of the trenches, or may not diffuse into lower parts of the trenches in sufficient concentrations for complete film conversion.

If the film conversion is incomplete, the resulting ILD 88 may have high levels of impurities, and/or may be of lower quality. For example, an oxygen concentration of ILD 88 (in case of an oxide film) may be lower, concentrations of impurities in ILD 88 may be higher, and an etch rate of ILD 88 may be higher than if ILD 88 is converted more completely. In FIGS. 17A-C and FIG. 18, ILD 88 has more completely converted at surfaces of ILD 88 that are farthest from the substrate 50, and has incompletely converted at portions of the ILD 88 that are between adjacent dummy gates 72 and between adjacent source/drain regions 82.

In FIG. 19, a high pressure anneal process 75 is performed. The high pressure anneal process 75 shown in FIG. 19 may be the same or similar to the high pressure anneal process 55 shown in FIG. 5, and the discussion above of high pressure anneal process 55 and FIGS. 4-10 is incorporated by reference as also being relevant to high pressure anneal process 75.

In some embodiments, FinFET device 100 is placed in a process chamber 73 of a high pressure anneal processing device (see, e.g., FIG. 30 and the discussion below of FIG. 30), and the high pressure anneal process 75 is performed. In some embodiments, the high pressure anneal process 75 is a wet high pressure anneal process. High pressure steam is formed in the process chamber 73 at a desired pressure, and the temperature of the process chamber 73 is raised to a desired anneal temperature. The desired pressure and the desired temperature of the process chamber 73 is maintained in the process chamber 73 for a desired length of time. Hot water is introduced into the process chamber 73 at a flow rate of about 1 SLM to about 50 SLM. In some embodiments, the desired pressure of the high pressure anneal process 75 may be greater than about 10 ATMs. The desired temperature of the high pressure anneal process 75 may be from about 200 C to about 500 C. The desired time of the high pressure anneal process 75 may be from about 10 minutes to about 120 minutes. The parameters of high pressure anneal process 75 may be the same or different as parameters of high pressure anneal process 55. In some embodiments, both high pressure anneal process 55 and high pressure anneal process 75 are performed. In other embodiments, only one of high pressure anneal process 55 and high pressure anneal process 75 are performed.

In some embodiments, the high pressure anneal process 75 may cause the diffusing molecules to penetrate more deeply into the CVD-based material of ILD 88, leading to a more complete film conversion. FIGS. 20A-C and 21 depict ILD 88 after the high pressure anneal process 75 is completed. Compared to ILD 88 prior to the high pressure anneal process 75, after the high pressure anneal process 75 the diffusing molecules have diffused deeper into ILD 88, and/or have diffused in higher concentrations into at least some parts of ILD 88, leading to a more complete film conversion. For example, portions of ILD 88 in trenches between adjacent source/drain regions 82 (see FIG. 20C), and in trenches between adjacent dummy gates 72 (see FIG. 21) have more completely converted into an oxide (or have completely converted into an oxide).

The high pressure anneal process 75 may result in ILD 88 being a higher quality film. For example, FIG. 7, discussed above in connection with high pressure anneal process 55, may also show an example of how the high pressure anneal process 75 may result in ILD 88 being a higher quality film. As discussed above, the left side of FIG. 7 shows TSA molecules (e.g. of ILD 88) that have only partially converted into silicon oxide. For example, the TSA molecules have partially reacted with $NH_3$ and $O_2$ diffusing into the TSA, creating the molecules shown on the left. The incompletely converted TSA includes nitrogen and hydrogen impurities. The right side of FIG. 7 shows that the high pressure anneal process 75 has enabled the ILD 88 to more completely convert into SiO, and the nitrogen and hydrogen impurities have been removed.

The high pressure anneal process 75 may also result in a higher quality film by lowering the wet etch rate of the ILD 88. For example, by increasing the concentration of the diffusing molecules in the ILD 88 (e.g., oxygen), the wet etch rate to the resulting ILD 88 may be lowered. In some embodiments, the wet etch rate of ILD 88 may be lowered by about 30% to about 50% compared to an atmospheric anneal process.

As discussed earlier in connection with FIG. 8, is possible to lower the wet etch rate of a material by raising the temperature of the wet etch process. However, as shown in FIG. 8, the temperature required for lowering the wet etch rate of the film may be relatively high. For example, the temperature required to lower the wet etch rate of ILD 88 to a desired point may be more that 550 C. By using high pressure anneal process 75, a wet etch rate of ILD 88 may be lowered to a desired point using a lower temperature than what would be required for a high temperature wet etch process. For example, high pressure anneal process 75 may be performed at temperatures of about 200 C to about 500 C, and may lower the wet etch rate of ILD 88 to a point that would have required a wet etch temperature of more than 550 C to achieve the same wet etch rate. In this manner, a thermal budget improvement may be achieved. Further, the need to raise FinFET device 100 to an undesirably high temperature that could degrade the device is avoided.

Some semiconductor formation processes may use an atmospheric pressure anneal process during the formation of the FCVD film. Compared to an atmospheric pressure anneal process, high pressure anneal process 75 may achieve better results. For example, FIG. 9 (discussed above in connection with high pressure anneal process 55, but which is also relevant to high pressure anneal process 75) shows a comparison of films formed using FCVD (e.g. ILD 88) after a high pressure anneal process (e.g. high pressure anneal process 75) and after an atmospheric anneal process, respectively. As shown in FIG. 9, the high pressure anneal process achieved superior results than an reference atmospheric pressure anneal process. A concentration gradient and a diffusing rate were improved in the film that underwent the high pressure anneal process. For example, the diffusing molecules diffused a greater distance into the film that underwent the high pressure anneal process. At a given depth, the concentration of the diffusing molecule was greater in the film that underwent the high pressure anneal process. FIG. 9 shows that high pressure anneal process 75 may result in a higher concentration gradient of the diffusing molecules in ILD 88, an increased diffusion rate in ILD 88, and the diffusing molecules may penetrate ILD 88 to a greater depth than if an atmospheric pressure anneal process were used.

As shown in FIG. 9, the high pressure anneal process 75 may yield better results than an atmospheric anneal process. For example, the high pressure anneal process 75 may result in the same, similar, or better results as the atmospheric anneal process using a lower annealing temperature. As such, a thermal budget improvement may be realized. Additionally, undesirably high temperatures that may degrade FinFET device 100 may be reduced or avoided. Further, the lower temperature processing may enable ILD 88 to have a higher density. In some embodiments, ILD 88 may have a density of more than 2 g/cm³. Compared to an atmospheric pressure anneal process, high pressure anneal process 75 may result in a 2 order improvement of film conversion. Further, compared to an atmospheric pressure anneal process, the diffusing molecules may realize a diffusion depth improvement of 10% to 50%. For example, the diffusing molecules may diffuse deeper into the CVD-based material of ILD 88, and higher concentrations of the diffusing molecules may be present at each depth of the CVD-based material of ILD 88. In some embodiments, compared to an atmospheric anneal process, oxidation of the film may be reduced by up to about 50%.

Some semiconductor formation processes may use multiple atmospheric pressure anneal processes during the formation of the FCVD film to achieve a desired result. Compared to multiple atmospheric pressure anneal process, in some embodiments a single high pressure anneal process 75 may be used to achieve the same, similar, or better results as the multiple atmospheric anneal process. In this manner a lower thermal budget may be realized, and processing time may be reduced.

As described in detail above in connection with FIGS. 4-10, by adjusting the parameters (e.g. pressure, temperature, time) of the high pressure anneal process 75, the characteristics of the resulting film may be similarly adjusted to achieve a desired result. For example, by adjusting the time of the high pressure anneal process the quality of the resulting film may be adjusted. Similarly, a pressure of the high pressure anneal may be adjusted, which may allow for adjustment of parameters such as concentration gradient, diffusion depth, and diffusion rate. In some embodiments, the pressure of the high pressure anneal process 75 may be adjusted between about 10 ATM and 25 ATM.

In some embodiments, high pressure anneal process 75 reduces impurities in ILD 88. For example, FIG. 10, discussed above in connection with high pressure anneal process 55, but which is also relevant to high pressure anneal process 75, shows a concentration of nitrogen (an impurity) versus depth for devices that respectively have undergone one of an atmospheric pressure (AP) anneal, a high pressure (HP) anneal, and no anneal ("as dep"). Point A and point B, shown on the depth axis in FIG. 10, correspond to points A and B shown in FIG. 6. As can be seen from FIG. 10, a concentration of nitrogen between points A and B is lowest for the device that underwent the high pressure anneal. In some embodiments, the high pressure anneal process 75 may cause a nitrogen concentration in the resulting film to have a concentration of $1e^{18}$ atoms/cm³ or lower. In this same manner, high pressure anneal process 75 may help in the removal of additional impurities in ILD 88, such as hydrogen.

Figure 22B:
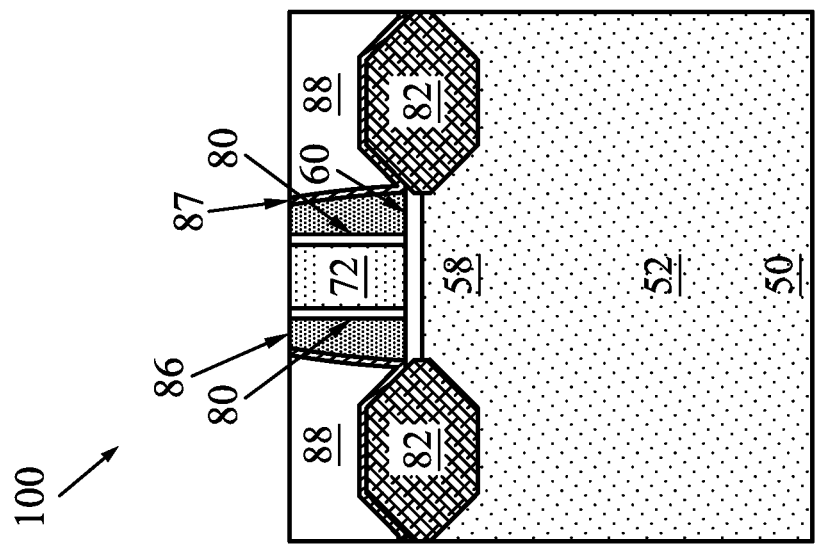
Figure 22A:
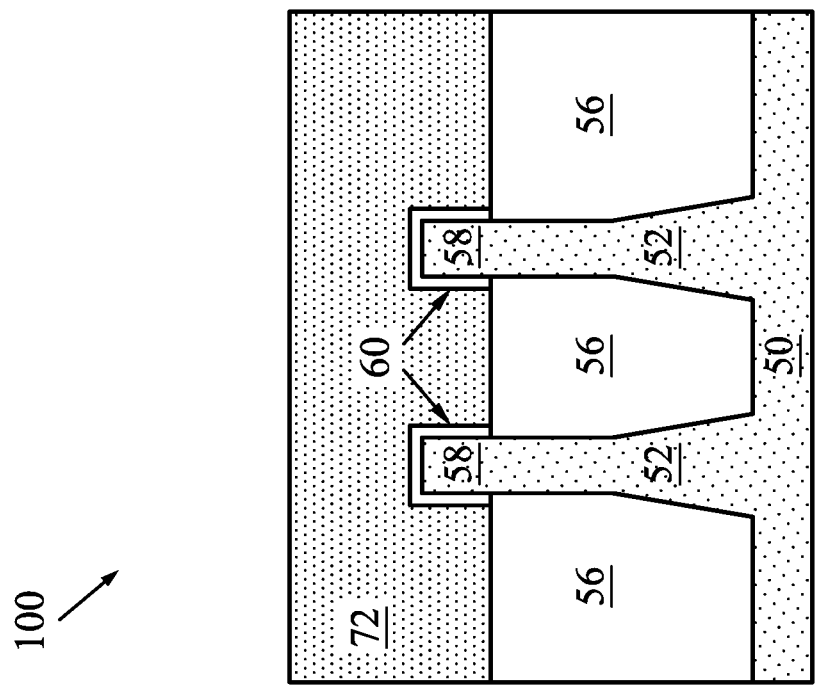

In FIGS. 22A and 22B, a planarization process, such as a CMP, may be performed to level the top surface of the ILD 88 with the top surfaces of the dummy gates 72. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the ILD 88 are level. Accordingly, the top surfaces of the dummy gates 72 are exposed through the ILD 88.

Figure 23B:
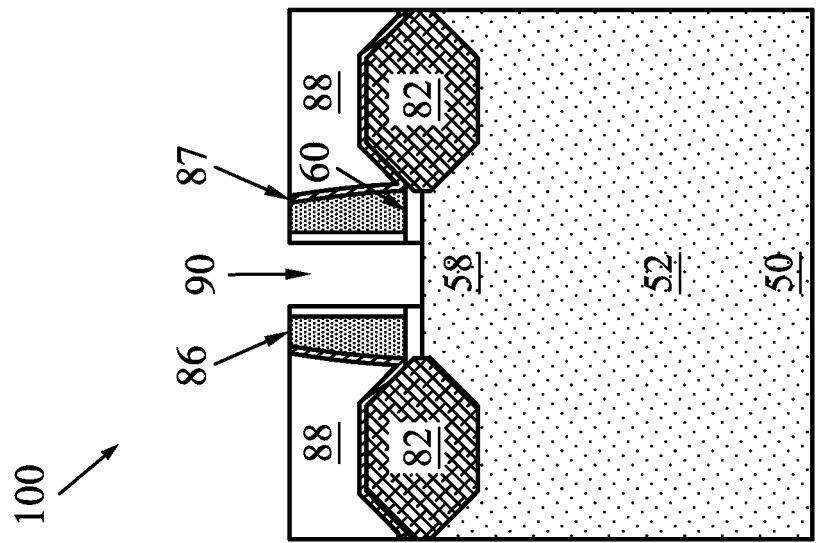
Figure 23A:
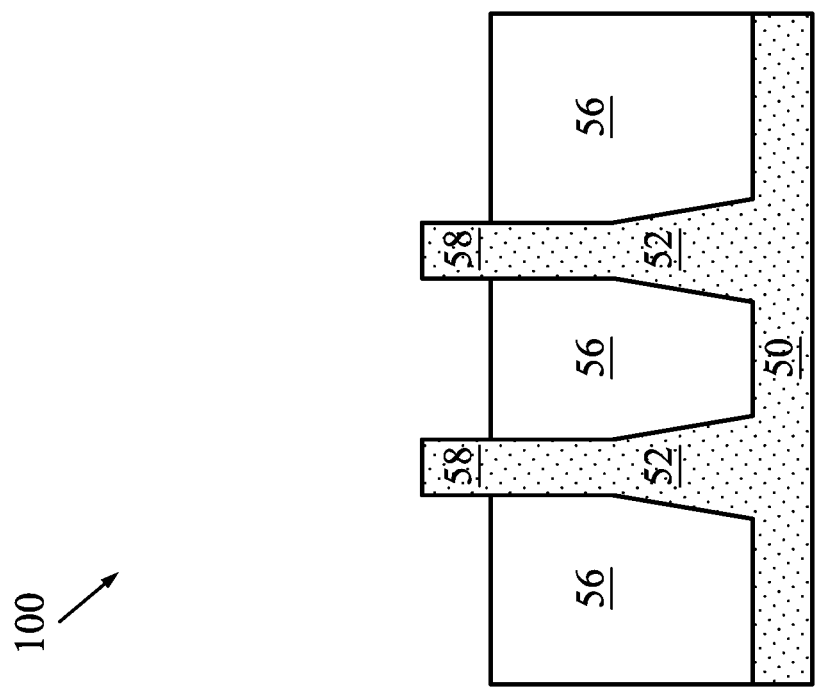

In FIGS. 23A and 23B, the dummy gates 72 and portions of the dummy dielectric layer 60 directly underlying the exposed dummy gates 72 are removed in an etching step(s), so that recesses 90 are formed. In some embodiments, the dummy gates 72 are removed by an anisotropic dry etch process. For example, the etching process may include a dry etch process using reaction gas(es) that selectively etch the dummy gates 72 without etching the ILD 88 or the gate spacers 86. Each recess 90 exposes a channel region of a respective fin 58. Each channel region is disposed between neighboring pairs of the epitaxial source/drain regions 82. During the removal, the dummy dielectric layer 60 may be used as an etch stop layer when the dummy gates 72 are etched. The dummy dielectric layer 60 may then be removed after the removal of the dummy gates 72.

Figure 24B:
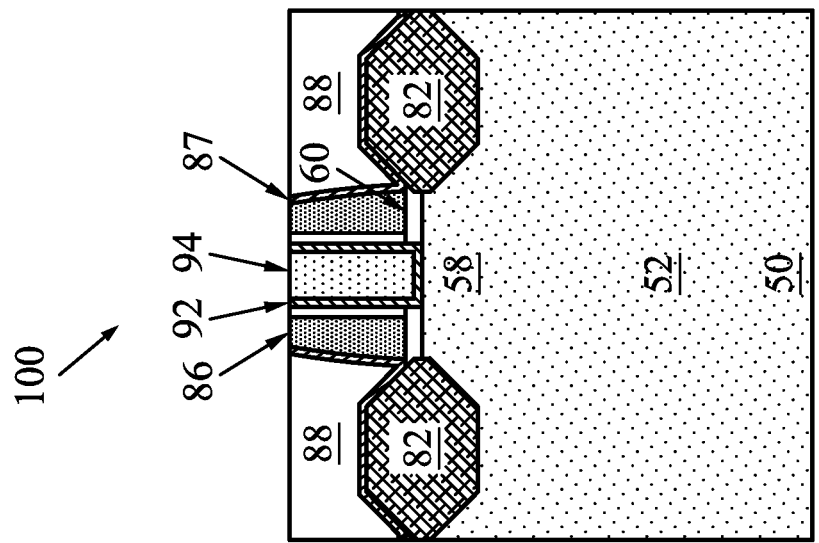
Figure 24A:
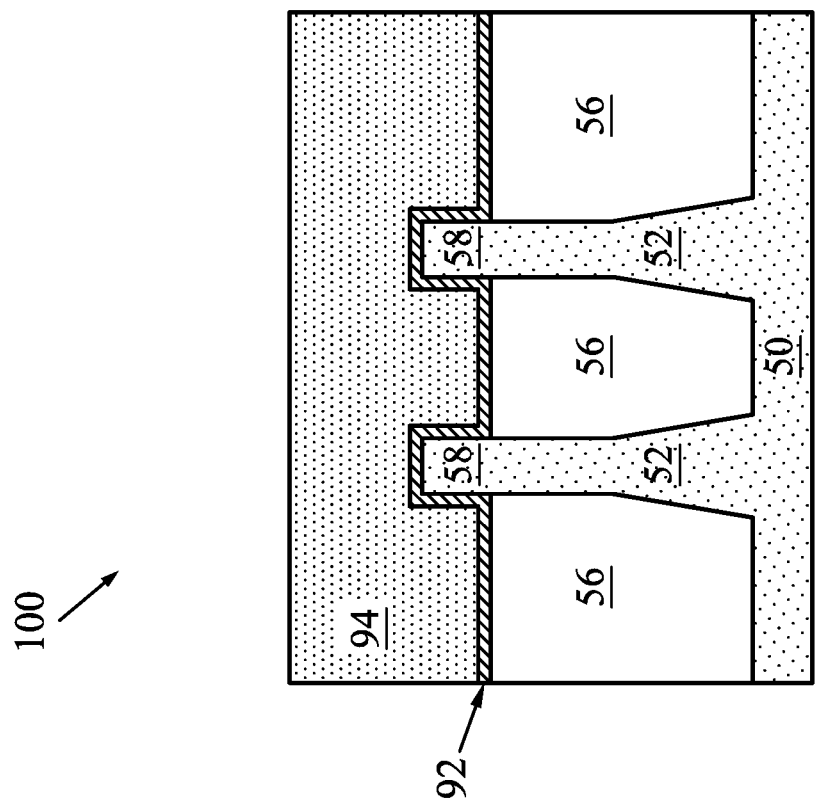

In FIGS. 24A and 24B, gate dielectric layers 92 and gate electrodes 94 are formed for replacement gates. Gate dielectric layers 92 are deposited conformally in the recesses 90, such as on the top surfaces and the sidewalls of the fins 58 and on sidewalls of the gate seal spacers 80/gate spacers 86. The gate dielectric layers 92 may also be formed on top surface of the ILD 88. In accordance with some embodiments, the gate dielectric layers 92 comprise silicon oxide, silicon nitride, or multilayers thereof. In some embodiments, the gate dielectric layers 92 are a high-k dielectric material, and in these embodiments, the gate dielectric layers 92 may have a k value greater than about 7.0, and may include a metal oxide or a silicate of Hf, Al, Zr, La, Mg, Ba, Ti, Pb, and combinations thereof. The formation methods of the gate dielectric layers 92 may include Molecular-Beam Deposition (MBD), ALD, PECVD, and the like.

The gate electrodes 94 are deposited over the gate dielectric layers 92, respectively, and fill the remaining portions of the recesses 90. The gate electrodes 94 may be a metal-containing material such as TiN, TaN, TaC, Co, Ru, Al, combinations thereof, or multi-layers thereof. For example, although a single gate electrode 94 is illustrated, any number of work function tuning layers may be deposited in the recesses 90. After the filling of the gate electrodes 94, a planarization process, such as a CMP, may be performed to remove the excess portions of the gate dielectric layers 92 and the material of the gate electrodes 94, which excess portions are over the top surface of the ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate" or a "gate stack." The gate and the gate stacks may extend along sidewalls of a channel region of the fins 58.

The formation of the gate dielectric layers 92 in the region 50B and the region 50C may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and the gate electrodes 94 in each region may be formed by distinct processes, such that the gate electrodes 94 may be different materials. Various masking steps may be used to mask and expose appropriate regions when using distinct processes.

Figure 25B:
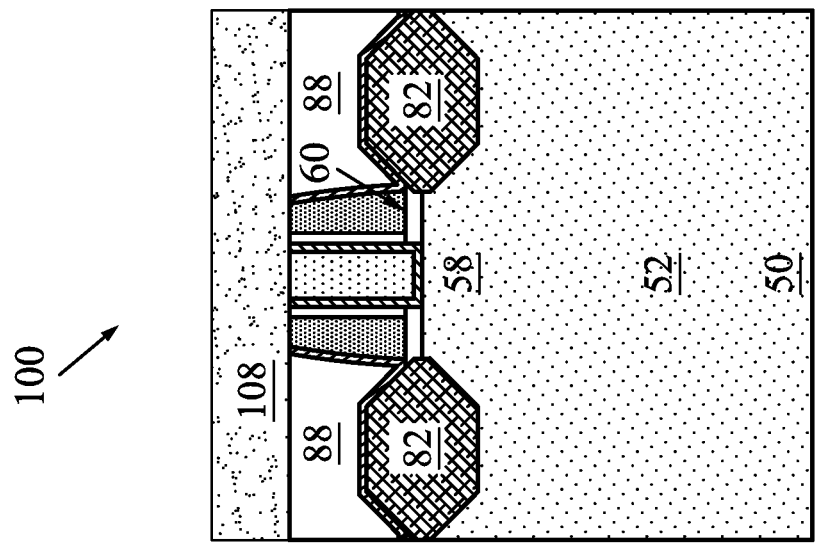
Figure 25A:
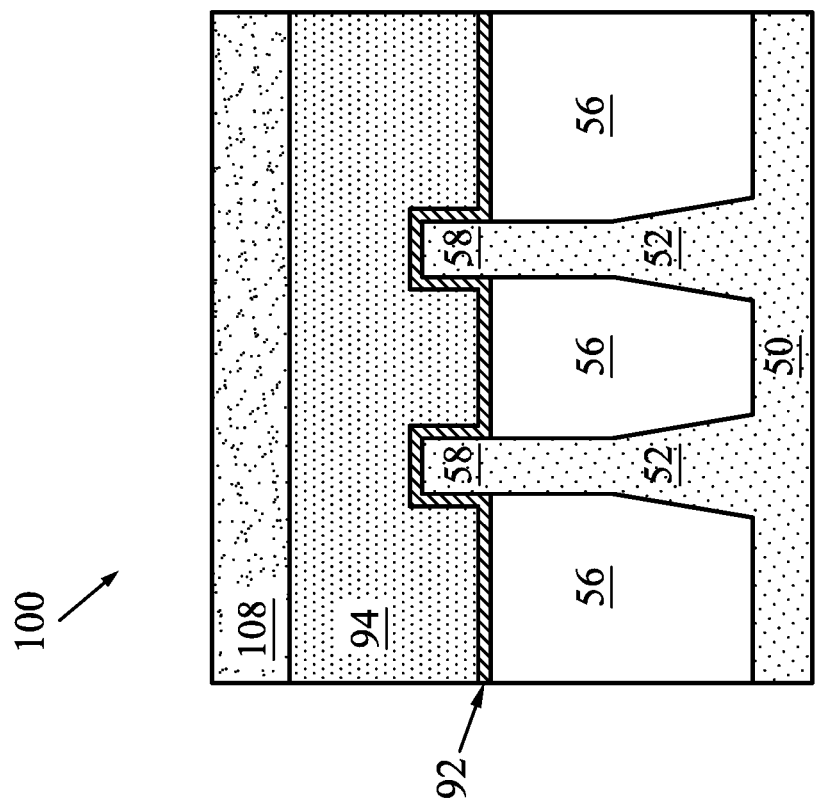

In FIGS. 25A and 25B, an ILD 108 is deposited over the ILD 88. In an embodiment, the ILD 108 is a flowable film formed by a flowable CVD method. In some embodiments, the ILD 108 is formed of a dielectric material such as PSG, BSG, BPSG, USG, or the like, and may be deposited by any suitable method, such as CVD and PECVD.

Figure 26B:
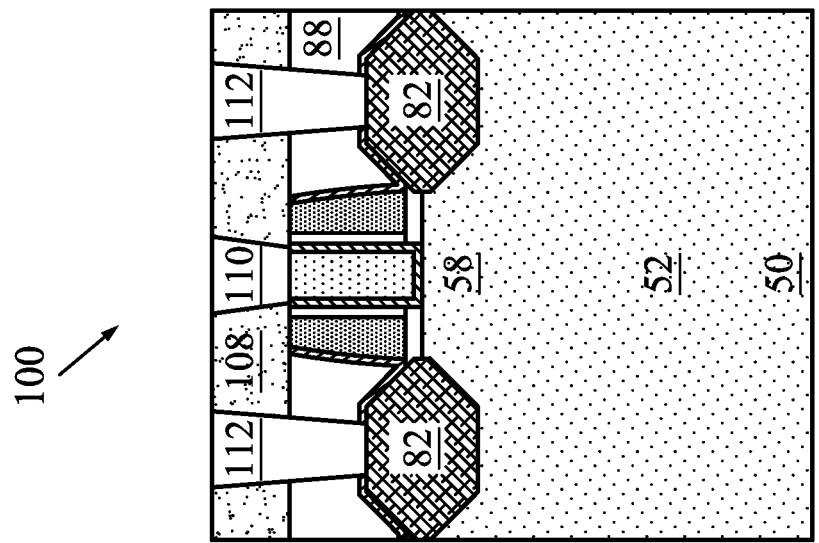
Figure 26A:
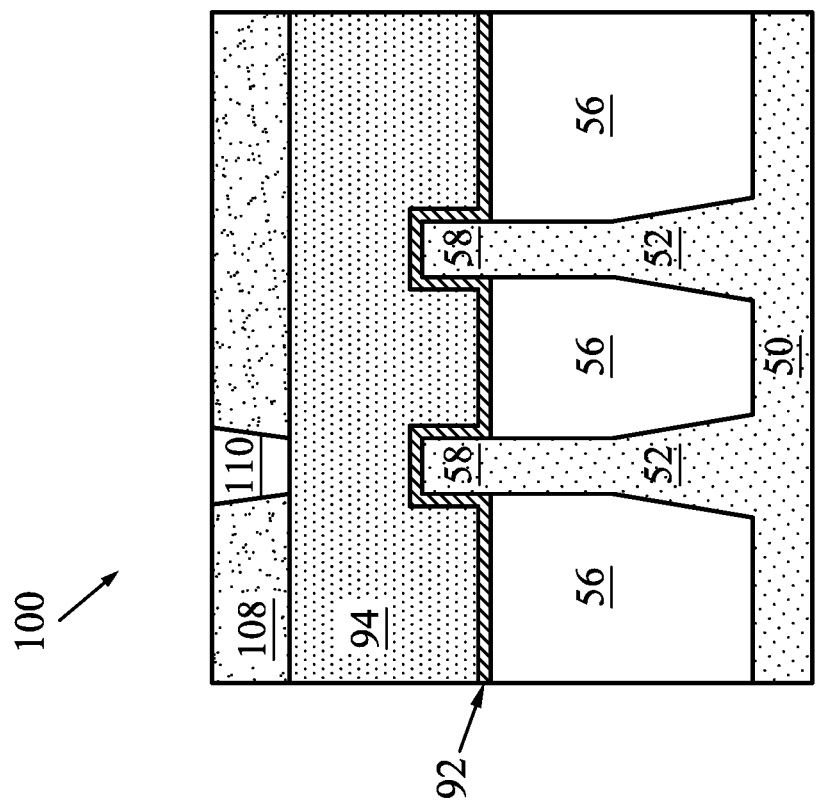

In FIGS. 26A and 26B, contacts 110 and 112 are formed through the ILD 108 and the ILD 88. The contacts 110 and 112 are formed of tungsten in some embodiments, although any suitable metal material may be used. In some embodiments, an anneal process may be performed to form a silicide at the interface between the epitaxial source/drain regions 82 and the contacts 112 prior to the contacts 112 being formed. The contact 110 is physically and electrically connected to the gate electrode 94, and the contacts 112 are physically and electrically connected to the epitaxial source/drain regions 82. FIGS. 26A and 26B illustrate the contacts 110 and 112 in a same cross-section; however, in other embodiments, the contacts 110 and 112 may be disposed in different cross-sections. Further, the position of contacts 110 and 112 in FIGS. 26A and 26B are merely illustrative and not intended to be limiting in any way. For example, the contact 110 may be vertically aligned with the fin 52 as illustrated or may be disposed at a different location on the gate electrode 94. Furthermore, the contacts 112 may be formed prior to, simultaneously with, or after forming the contacts 110.

In FIGS. 27A and 27B, one or more interconnect layers, such as interconnect layers 128, may be formed over ILD 108. Interconnect layers 128 may respectively include conductive lines 132, vias 130, and a dielectric layer 138. Conductive lines may extend laterally in a respective dielectric layer 138. Vias 130 may electrically connect an overlying electrical feature (e.g. a conductive line 132) to an underlying electrical feature (e.g. a conductive line 132, or a contact 110/112). Conductive lines 132 and/or vias 130 may be formed to electrically and/or physically connect to contacts 110 and 112, and/or to other devices within FinFET device 100 (not shown). In some embodiments, conductive lines 132 and/or vias 130 may connect contacts 110 and 112 to each other or to external components, a power node, a ground node, or the like. One or more etch stop layers 133 may be formed, where each etch stop layer 133 separates an overlying layer (e.g. a dielectric layer 138) from an underlying layer (e.g. another dielectric layer 138 or ILD 108).

In an embodiment vias 130 and conductive lines 132 may be formed using, e.g., a dual damascene process, whereby an opening for both vias 130 and conductive lines 132 in a given interconnect layer 128 are formed within a respective dielectric layer, such as dielectric layer 138. In an embodiment an etch stop layer 133 is formed on ILD 108, for example using a deposition process. Etch stop layer 133 may comprise silicon nitride in some embodiments, although any suitable material may be used. Dielectric layers 138 are formed on etch stop layers 133. In some embodiments, dielectric layers 138 are formed of a polymer, which may be a photo-sensitive material such as polybenzoxazole (PBO), polyimide, benzocyclobutene (BCB), a combination thereof, or the like, that may be patterned using lithography. In other embodiments, dielectric layers 138 are formed of a nitride such as silicon nitride, an oxide such as silicon oxide, PhosphoSilicate Glass (PSG), BoroSilicate Glass (BSG), Boron-doped PhosphoSilicate Glass (BPSG), or the like. Dielectric layers 138 may be formed by spin coating, lamination, chemical vapor deposition (CVD), or the like.

Openings for conductive lines 132 and vias 130 may be formed by placing and patterning a photoresist material over a respective dielectric layer 138. Once the photoresist material has been placed and patterned, a dry etch process such as a reactive ion etch may be utilized to transfer the pattern from the patterned photoresist to the underlying dielectric layer 138. This process may be repeated to form both the via portion of the opening and the trench portion of the opening. The etch process may terminate upon detection of, and etching through, etch stop layer 133.

Once the opening has been formed, the opening may be filled with a conductive material in order to form vias 130 and conductive lines 132 within the respective dielectric layer 138. In an embodiment the formation of the conductive material may be initiated by first depositing a barrier layer (not separately illustrated in FIGS. 27A and 27B). The barrier layer may be a barrier material such as titanium nitride or tantalum nitride which may be deposited using a deposition process such as chemical vapor deposition, physical vapor deposition, atomic layer deposition, or the like. However, any suitable material or method of deposition may be utilized to form the barrier layer.

Once the barrier layer has been formed, a conductive material may be deposited to fill and/or overfill the openings within the respective dielectric layer 138. In an embodiment the conductive material may be a material such as copper, tungsten, ruthenium, titanium dioxide, a combination thereof, or the like, formed, e.g., using a seed layer (not shown) and a plating process, such as electrochemical plating, although other processes of formation, such as sputtering, evaporation, or a PECVD process, may alternatively be used depending upon the desired materials. Once the openings have been filled with conductive material, any excess conductive material outside of the openings may be removed, and conductive lines 132 and the respective dielectric layer 138 may be planarized using, for example, a chemical mechanical polishing process.

The above processes may be repeated as necessary in order to form a number of interconnect layers 128 that is required for a particular package design, for example as shown in FIGS. 27A and 27B.

In some embodiments, die connectors 160 are formed over the interconnect layers 128. The die connectors 160 are respectively coupled to a respective uppermost conductive line 132' that is farthest from substrate 50. Die connectors 160 may provide external electrical connections to FinFET device 100. A passivation film 140 is formed on uppermost dielectric layer 138' and on portions of the respective uppermost conductive lines 132' to which the die connectors 160 are respectively coupled. Passivation layer 140 may be formed of a same material as etch stop layers 133 in some embodiments. Openings through the passivation film 140 are made to the respective uppermost conductive lines 132' to which the die connectors 160 are respectively coupled. Die connectors 160, such as conductive pillars (for example, comprising a metal such as copper), are in the openings through passivation film 140 and are mechanically and electrically coupled to the respective uppermost conductive line 132' to which the respective die connectors 160 are respectively coupled. The die connectors 160 may be formed by, for example, plating or the like.

A dielectric material 162 is on the passivation film 140 and sidewalls of the die connectors 16o. The dielectric material 162 laterally encapsulates the die connectors 16o. The dielectric material 162 may be a polymer such as PBO, polyimide, BCB, or the like; a nitride such as silicon nitride or the like; an oxide such as silicon oxide, PSG, BSG, BPSG, or the like; the like, or a combination thereof, and may be formed, for example, by spin coating, lamination, CVD, or the like.

As shown in FIGS. 27A-27B, interconnect layers 128 form an interconnect region 129. Interconnect 129 comprises multiple etch stop layers 133 and dielectric layers 138. In some embodiments, dangling bonds may be present along the interfaces of etch stop layers 133 and dielectric layers 138. Dangling bonds may reduce the strength of the bonding between the adjacent layers and decrease reliability of the FinFET device 100.

Figure 28:
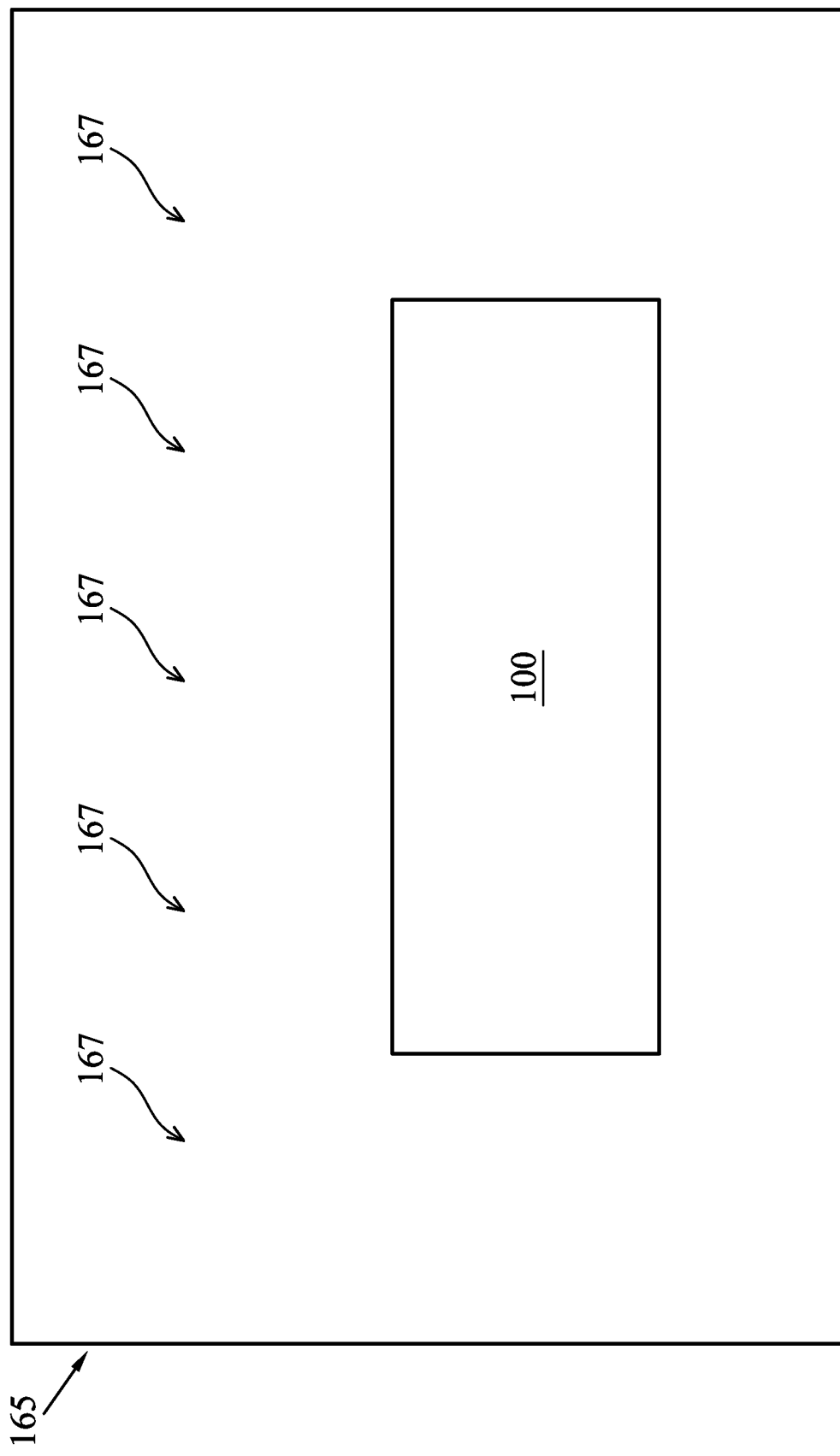
FIG. 28 depicts a FinFET device undergoing an anneal process in accordance with some embodiments.

Referring to FIG. 28, FinFET device 100 is placed in a process chamber 165 of a high pressure anneal processing device (see FIG. 30 and the discussion below of FIG. 30), and a high pressure anneal process 167 is performed. In some embodiments, the high pressure anneal process 167 is a high pressure dry anneal process. One or more pressurized gases are flowed from pressurized gas sources into process chamber 165 to create a desired pressure in process chamber 165, and temperature of the process chamber 165 is raised to a desired anneal temperature. The desired pressure and the desired temperature of the process chamber 165 are maintained in the process chamber 165 for a desired length of time. In some embodiments, the process gas(es) comprise nitrogen gas ($N_2$), hydrogen gas ($H_2$), deuterium gas ($D_2$), or the like. In some embodiments, the process gas(es) comprise gases that are composed of relatively small molecules, to allow the molecules of the process gas(es) to penetrate into FinFET device 100. In some embodiments, nitrogen gas may be flowed into the process chamber at a flow rate of about 1 SLM to about 50 SLM. In some embodiments, deuterium gas may be flowed into the process chamber at a flow rate of about 1 SLM to about 50 SLM. In some embodiments, the desired pressure of the high pressure anneal process 167 may be greater than about 10 ATMs, for example between about 10 ATMs and 25 ATMs. The desired temperature of the high pressure anneal process 167 may be from about 200 C to about 500 C. The desired time of the high pressure anneal process 167 may be from about 10 minutes to about 120 minutes. The parameters of high pressure anneal process 167 may be the same or different as parameters of high pressure anneal processes 55 and 75.

During high pressure dry anneal process 167, molecules of the process gas(es), which are generally smaller in size than molecules of the layers of the interconnect region 129, may penetrate into interconnect region 129. The molecules may react with dangling bonds of the interconnect region 129, such as the dangling bonds present along the interfaces between etch stop layers 133 and dielectric layers 138. The reaction may cause molecules of the process gas(es) to terminate the dangling bond. For example, an interface between an etch stop layer 133 and a dielectric layer 138 may have dangling silicon bonds, denoted by Si*. When hydrogen ($H_2$) gas is used as a process gas for high pressure anneal process 167, hydrogen molecules may penetrate into interconnect region 129 to reach the dangling Si* bonds. Hydrogen molecules may operate to terminate the dangling Si* bonds, creating SiH. This reaction may be represented by the following reaction equation: $Si*+H_2 \rightarrow 2SiH$. In this manner, strength of the interface may be improved, and correspondingly reliability of the FinFET device 100 may be improved.

During high pressure dry anneal process 167, molecules of the process gas may also penetrate into the channel region of FinFET device 100. For example, dangling bonds may be present in the FinFET device 100 along the interface of gate dielectric layer 92 and fin 58 proximate to gate dielectric layer 92 (the channel region). The dangling bonds may be formed from the deposition process used to form gate dielectric layer 92. These dangling bonds may reduce mobility of the channel region, and may negatively impact the recovery ability of FinFET device 100. During high pressure dry anneal process 167, the process gas(es) may penetrate into FinFET device 100 to the interface of gate dielectric layer 92 and the channel region of fin 58, and may repair the dangling bonds (e.g. by terminating the dangling bonds as described above). In this manner, the interface between gate dielectric layer 92 and the channel region of fin 58 may be strengthened. Additionally, mobility of the channel may be improved, and FinFET device 100 may have an improved recovery ability.

In some embodiments, each of high pressure anneal process 55, high pressure anneal process 75, and high pressure anneal process 167 are performed. In other embodiments, only one of high pressure anneal process 55, high pressure anneal process 75, and high pressure anneal process 167 is performed, or only two of these is performed. In FIG. 28, high pressure dry anneal process 167 is performed after the forming of interconnect region 129 (shown in FIGS. 27A-B). In embodiments in which high pressure dry anneal process 167 is performed after the forming of interconnect region 129, a concentration of the one or more process gas(es) used during the high pressure dry anneal process 167 may exist in the interconnect region 129 after the high pressure dry anneal process 167 is performed. For example, a concentration of the one or more process gas(es) may be highest in an interconnect layer 128 that is farthest from substrate 50, and lowest in an interconnect layer 128 that is closest to the substrate 50. In some embodiments, high pressure anneal process 167 may be performed earlier or later in the described processing steps. For example, high pressure anneal process 167 may be performed after the contacts 110/112 are formed (shown in FIGS. 26A-B).

Figure 29:
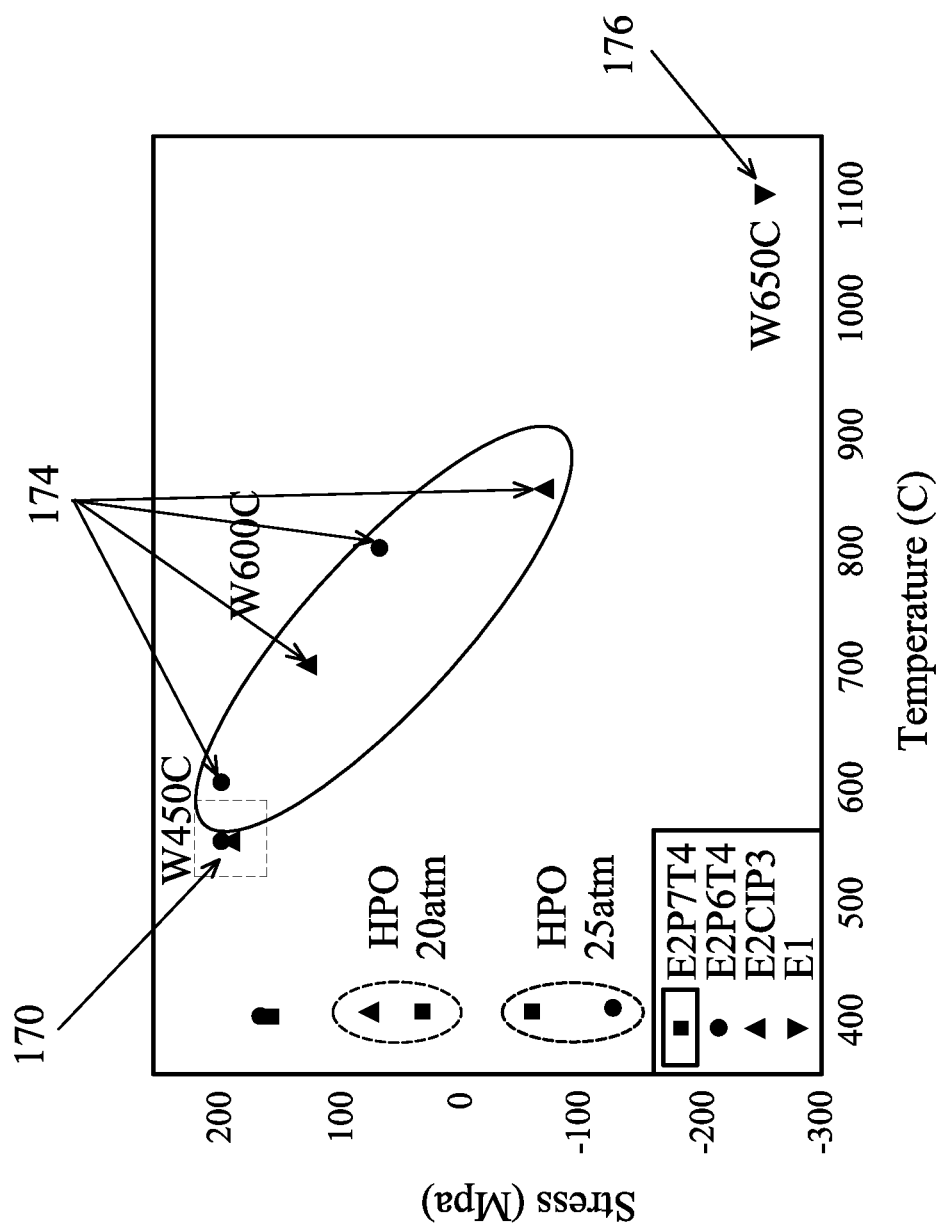
FIG. 29 is a chart showing stress versus temperature for FinFET devices that have undergone different processing steps in accordance with some embodiments.

As described above, it is possible to adjust parameters of high pressure wet anneal processes 55/75 to achieve different results. It is similarly possible to adjust the parameters of high pressure dry anneal process 167 to achieve different results. It is further possible to collectively adjust the parameters of high pressure wet anneal process 55/high pressure wet anneal process 75 and high pressure dry anneal process 167 to achieve a particular result. For example, parameters of high pressure wet anneal process 55/high pressure wet anneal process 75 and high pressure dry anneal process 167 may be adjusted to adjust the stress of the resulting film. FIG. 29 depicts different film stresses that are achieved by adjusting anneal temperatures of a high pressure wet anneal process and a high pressure dry anneal process. In FIG. 29, the horizontal temperature axis indicates a temperature of a high pressure dry anneal process. The temperature values in the chart (identified by a preceding "W") indicate temperatures of a high pressure wet anneal process that was performed. For example, data points 170 show stresses of films (i.e. ILD 88 and/or STI 56) that were formed using a high pressure wet anneal process at a temperature of about 450 C, followed by a high pressure anneal process at a temperature of about 550 C. Data points 174 show stresses of films (i.e. ILD 88 and/or STI 56) that were formed using a high pressure wet anneal process at a temperature of about 600 C, followed by a high pressure anneal process at temperatures shown on the horizontal temperature axis. Data point 176 shows a stress of a film (i.e. ILD 88 and/or STI 56) that was formed using a high pressure wet anneal process at a temperature of about 650 C, followed by a high pressure anneal process at a temperature of about 1100 C. As shown by the varying stress levels shown in FIG. 29 by data points 170, 174, and 176, the stress of the resulting film may be adjusted to a desired point by collectively adjusting the temperatures of a high pressure wet anneal process and a high pressure dry anneal process.

The stresses of the resulting films may also be adjusted by adjusting the pressures of the high pressure anneal processes 55/75. As shown in FIG. 29, high pressure wet anneal processes (identified as "HPO" in FIG. 29) that were performed using an anneal pressure of about 20 ATM resulted in films having stress levels between 0 and 100, and high pressure wet anneal processes that were performed using an anneal pressure of about 25 ATM resulted in films having stress levels between 0 and −200. As such, FIG. 29 indicates how the stress levels of resulting films may be adjusted by varying the pressures of a high pressure wet anneal used to form the films.

As described above, parameters of a high pressure wet anneal process and parameters of a high pressure dry anneal process may be collectively or individually adjusted to adjust a stress of a resulting film. In some embodiments, the stress of the resulting film may be adjusted between about −200 Mpa and 200 Mpa.

In subsequent processing, one or more cleaning processes may be performed. Additionally, one or more tests of FinFET device 100 may be performed.

Figure 30:
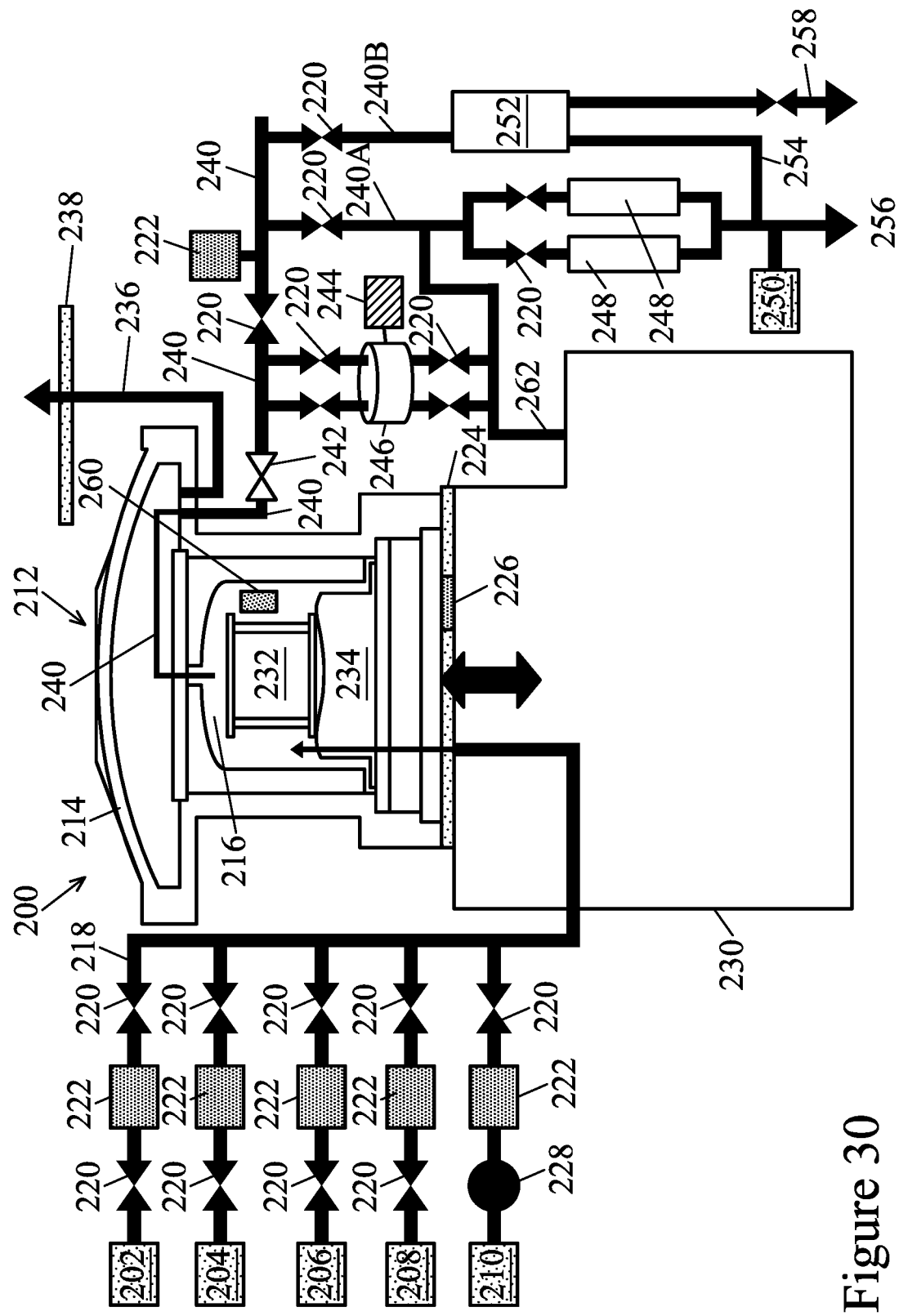
FIG. 30 is a schematic of a high pressure anneal processing device in accordance with some embodiments.

FIG. 30 shows a schematic of a high pressure anneal processing device 200 in accordance with some embodiments. High pressure anneal processing device 200 may be configured to perform high pressure wet anneal processes and/or high pressure dry anneal processes, for example as described above in connection with FIGS. 1-29. A main body 212 of the high pressure anneal processing device 200 may include an outer shell 214 and an inner shell 216. The inner shell 216 is comprised within the outer shell 214. The inner shell 216 defines a processing chamber for the high pressure anneal processes. In some embodiments, the inner shell 216 is made of quartz. The outer shell 214 provides a safety enclosure in the case of malfunction of equipment involving pressurized gases (for example if the inner shell 216 is compromised). In some embodiments the outer shell 214 is formed of metal, and may have a strength capable of withstanding more than 37 ATM. A chamber door 224 may be disposed in a sidewall or a bottom surface of the outer shell 214 to allow devices to be moved into and out of the main body 212.

In FIG. 30, chamber door 224 is on a bottom surface of outer shell 214. A lock 226 suitable for high pressure sealing is used to seal the outer shell closed during high pressure anneal processes. In some embodiments, lock 226 may be a breech lock, although any suitable locking mechanism may be used. The breech lock 226 may use an "open" cylinder (not shown) to open the chamber door 224, a "close" cylinder (not shown) to close the chamber door 224, and a "lock" cylinder (not shown) to lock the breech lock 226. In some embodiments a same "open/closed" cylinder (not shown) may be used to open and close the chamber door 224. An "open" sensor (not shown) and/or a "closed" sensor (not shown) may be provided to indicate (e.g. to a controller) whether the chamber door 224 is closed or open. A "lock" sensor (not shown) may be provided to indicate whether the breech lock 226 is locked. A locking arm (not shown) may be included in the breech lock 226 to lock the chamber door 224 closed.

One or more pressurized gas sources (202, 204, 206, and 208) may be provided. In some embodiments, pressurized gas sources (202, 204, 206, and 208) may be factory supplied high pressure bottles. Pressurized gas sources may include a nitrogen gas supply 202, a hydrogen gas supply 204, an oxygen gas supply 206, a deuterium gas supply 208, or the like. The depicted gas sources (202, 204, 206, and 208) in FIG. 19 are exemplary. In some embodiments, fewer or additional pressurized gas sources may be provided, and the pressurized gas sources may include the identified gases or other suitable gases.

Pressurized gas sources (202, 204, 206, and 208) for use in a high pressure dry anneal process are connected to the main body 212 using welded piping 218. Various valves 220 and flow control/measurement devices 222 are provided along the welded piping 218. As shown in FIG. 30, different process gases may flow through the same welded piping (at least in part). In other embodiments different process gases are provided with separate welded piping.

A water source 210 may also be provided for use in a high pressure wet anneal process. Water source 210 may provide de-ionized water (DI water) in accordance with some embodiments. Water source 210 may also provide pre-heated water in order to facilitate the conversion of the hot water into steam for the high pressure wet anneal process. A pump 228 may be used to pump water from water source 210 into the main body 212 using welded piping 218. Various valves 220 and measurement/flow control devices 222 may be provided in the welded piping 218 in which the hot water flows. In some embodiments, as depicted in FIG. 30, the hot water from water source 210 may share welded piping with process gases from pressurized gas sources 202, 204, 206, and 208. In other embodiments, different welded piping is used for hot water from water source 210.

FIG. 30 depicts a particular number and arrangement of valves 220 and measurement/flow control devices 222. In other embodiments, different numbers and/or placements of measurement/flow control devices 222 and valves 220 may be used according to different design requirements. Valves 220 and measurement/flow control devices 222 may respectively be the same type of devices or different types of devices.

A loading chamber 230 is disposed adjacent to chamber door 224. Semiconductor devices that will undergo a high pressure anneal process using high pressure anneal processing device 200 may be comprised in a wafer boat 232, which is loaded onto wafer chuck 234 either before or after wafer chuck 234 is disposed in loading chamber 230. A motor (not shown) may be used to move the wafer chuck 234 and the wafer boat 232 from the loading chamber 230 into place in the inner chamber of the inner shell 216 for the high pressure anneal process. The wafer boat and the wafer chuck may be sealed in the main body 121 by the chamber door 224 and the breech lock 226. After the process completes, breech lock 226 and the chamber door 224 are opened, and the wafer chuck 234 may be moved back into the loading chamber 230. The wafer boat 232 may be removed from the wafer chuck 234 for subsequent processing.

FIG. 30 depicts the welded piping entering the loading chamber 230 and entering the main body 212 from the bottom of main body 212. This is for purposes of illustration only. The welded piping may enter the main body 212 and extend to the inner chamber of the inner shell using any suitable route.

Various vent pipes and drain pipes are included in high pressure anneal processing device 200. In some embodiments, a safety vent 236 extends from an inner chamber of the outer shell 214, through the factory roof 238 to the outside air. A pressure relief device, such as a rupture disc or burst diaphragm, may be provided in the safety vent, to provide emergency pressure relief in the inner chamber of the outer shell 214 in the case that the inner shell 216 is compromised and the inner chamber of the outer shell 214 becomes pressurized.

A process vent line 240 may extend from an inner chamber of the inner shell 216 out of the main body 212. A manual valve 242 may be provided in the process vent line 240 as a fail-safe for an abnormal closing or blockage of process vent line 240. Process vent line 240 may additionally comprise one or more valves 220 and/or measurement/flow control devices 222.

In some embodiments, a detector 246 has an inlet connection and an outlet connection to process vent line 240, as well as an inlet connection and an outlet connection to a vent line 262 that provides an outlet from loading chamber 230. The detector 246 may detect levels of certain gases present in the process vent line 240. For example, in some embodiments the detector 246 may detect levels of hydrogen gas and/or oxygen gas in the process vent line 240. The inlet connection and the outlet connection of detector 246 to process vent line 240 may respectively comprise a valve 220, and the inlet and outlet connection of detector 246 to vent line 262 may also respectively comprise a valve 220. Detector 246 may be coupled to controller 244 in a manner that controller 244 can control the operation of detector 246 and controller 244 may receive detection signals from detector 246.

In some embodiments, controller 244 may be configured to control components of high pressure anneal processing device 200. For example, the controller is coupled to valves 220 and measurement/flow control devices 222 used by high pressure anneal processing device 200, and is configured to read signals from and/or control the operation of the valves 220 and measurement/flow control devices 222. In this manner, the controller 244 may initiate a high pressure anneal by causing one or more process gases or hot DI water to flow into inner shell 216 at desired flow rates. The controller 244 may be coupled to a temperature control device 260 disposed in the main body 212, and may cause the temperature control device to raise the temperature of the inner chamber of the inner shell 216 to a desired temperature.

In some embodiments, process vent line 240 may separate into process vents line 240A and process vent line 240B. Process vent line 240A may be for use following high pressure dry anneal processes, and process vent line 240B may be for use following high pressure wet anneal processes. Following a high pressure wet anneal process, process vent line 240A may be closed using a valve 220. Following a high pressure dry anneal process, process vent line 240B may be closed using a valve 220.

After a high pressure dry anneal process, process vent line 240A may contain dangerous (for example flammable or poisonous) process gases that were used in the high pressure dry anneal process. As such, various cleaning and dilution methods may be used on process vent line 240A to clear or dilute the used process gases. In some embodiments, process vent line 240A is input to one or more cleaners 248. Two cleaners 248 are shown in FIG. 30, although in some embodiments fewer or additional cleaners 248 may be used. The cleaners 248 are used to remove or reduce any remaining process gases (for example, hydrogen gas) flowing in process vent line 240A after being used in a high pressure dry anneal process. In some embodiments, cleaners 248 comprise scrubbers and/or low swirl combustion burners to remove hydrogen gas from the process vent line 240A. Additionally, diluted nitrogen may be added to process vent line 240A from a diluted nitrogen gas source 250 after the cleaners 248 to further dilute any remaining process gases in process vent line 240A. Process vent line 240A may extend to a designated area 256 for venting the process vent line 240A, such as an outside environment.

Process vent line 240B, which is opened following a high pressure wet anneal process, may contain gases (for example steam) or liquids (for example water). Process vent line 240B is input into a water separator 252, which operates to separate gases from liquids. Water separator 252 may have two outlets. A first outlet 254 is for gases (for example steam). The first outlet 254 may be input to the process vent line 240A, to be processed similarly as described above for process vent line 240A. The first outlet 254 may extend to the designated area 256 for venting the process vent line 240A, or to another suitable location. The second outlet 258 may be for liquids (for example water). In some embodiments, the second outlet 258 is recirculated back to water source 210 for use in a subsequent high pressure wet anneal processes.

As described earlier, an initial step of a high pressure anneal process in accordance with some embodiments is to load a wafer boat 232 comprising one or more semiconductor devices (e.g. FinFET device 100) onto wafer chuck 234. During the loading, wafer chuck 234 may be disposed in loading chamber 230. Next, the wafer chuck 234 is moved into the main body 212, for example using a motor (not shown). The motor may be connected to a controller (for example controller 244) that controls the movement of the motor, which in turn controls the movement of the wafer chuck 234. The wafer chuck 234 is positioned in the main body 212 so that the wafer boat 232 is disposed in an inner chamber of inner shell 216, and the inner chamber is sealed for processing. Chamber door 224 is closed, sealing the inner shell 216, the wafer boat 232, and the wafer chuck 234 within the outer shell 214. A lock 226 locks the chamber door 224 into place. Chamber door 224 and lock 226 may be controlled manually, or by a controller (for example controller 244).

After the outer shell 214 is securely closed and locked, the high pressure anneal process may begin. The high pressure anneal process may be a wet anneal process or a dry anneal process. During a wet anneal process, hot DI water is pumped from water source 210, through welded pipes 218, into the inner chamber of inner shell 216. A flow rate of the hot DI water may be from about 1 SLM to about 50 SLM. Temperature control device 260 raises the temperature of the inner chamber of inner shell 216 to an anneal temperature. In some embodiments, the anneal temperature is about 200 C to about 500 C. The hot temperature causes the hot DI water to turn into steam, which becomes pressurized steam in the inner chamber. The desired pressure of the inner chamber is more than about 10 ATMs in some embodiments. By changing the flow rate of the hot DI water flowing into the inner chamber of inner shell 216, the pressure of the inner chamber may be controlled. In some embodiments, the high pressure wet anneal process may have a duration of about 10 minutes to about 120 minutes.

When the high pressure wet anneal process is complete, the hot DI water from water source 210 is terminated, and the temperature control device 260 allows the temperature of the inner chamber of inner shell 216 to cool. Vent line 240B is opened, allowing gases (e.g. steam) and liquids (e.g. water) to vent through outlet 254 and 258, respectively. After the pressure of the inner chamber has lowered and the temperature has cooled to within desired limits, the lock 226 is opened, allowing chamber door 224 to be opened. The wafer chuck 234 and the wafer boat 232 are moved back into the loading chamber 230. The wafer boat 232 may be removed from the wafer chuck 234 for further processing.

The high pressure anneal process may also be a dry anneal process. An initiation process of the high pressure dry anneal process is the same as, or similar to, the initiation of the high pressure wet anneal process described above. After the outer shell 214 is securely closed and locked, the high pressure anneal dry process may begin. During a dry anneal process, one or more process gases may be flowed from one or more of pressurized gas sources 202, 204, 206, and 208 through welded pipes 218 into the inner chamber of inner shell 216. The one or more process gases are pressurized, which pressurizes the inner chamber of inner shell 216 to a desired pressure. The pressure of the inner chamber of inner shell 216 may be controlled by controlling a flow rate of the one or more process gases into the inner chamber of inner shell 216. In some embodiments, the one or more process gases may be flowed into the inner chamber of inner shell 216 at flow rates of about 1 SLM to about 50 SLM. The pressure of the inner chamber of the inner shell 216 may be raised to about 1 ATM to about 23 ATM. The temperature control device 260 may raise the temperature of the inner chamber of the inner shell 216 to a desired temperature. In some embodiments, the desired temperature may be from about 200 C to about 500 C.

The high pressure dry anneal may continue for a desired anneal time. In some embodiments, the desired anneal time is about 10 minutes to about 120 minutes.

When the high pressure dry anneal time is complete, the flow of the one or more process gases to the inner chamber of the inner shell 216 are terminated. Process vent line 240A is opened, allowing process gases to vent from the inner chamber, and allowing the process environment in the inner chamber to be de-pressurized. In some embodiments, the inner chamber of the inner shell 216 is flushed with a non-dangerous gas to reduce the levels of potentially dangerous gases in the inner chamber of the inner shell. For example, the inner chamber of the inner shell 216 may be flushed with nitrogen gas from nitrogen gas supply 202.

The one or more process gases flowing through process vent line 240A are input to cleaners 248, which eliminate or reduce the presence of certain gases. For example, cleaners 248 may be scrubbers and/or burners which eliminate or reduce the levels of hydrogen gas flowing through process vent line 240A. The outlets of cleaners 248 may be diluted by the addition of a diluted gas (for example diluted nitrogen gas) from gas source 250. Process vent line extends to a designated area 256 for venting the remaining gases flowing through process vent line 240 A.

The inlet connection and outlet connection of detector 246 is opened to the process vent line 240. The detector 246 monitors the levels of detected gases flowing in process vent line 240 during the flushing of the inner chamber. For example, the detector 246 may monitor the level of hydrogen gas and/or oxygen gas in the process vent line. The detector 246 may communicate the current levels of detected gases in process vent line 240 to controller 244. When the levels of the detected gas have fallen beyond a preset threshold, the controller 244 may allow the lock 226 to be opened and chamber door 224 to be opened. In some embodiments, the preset threshold for hydrogen gas may be about 0.001 ppm to about 0.1 ppm.

When the chamber door 224 opens, the wafer boat 232 and the wafer chuck 234 may begin to be lowered into the loading chamber 230. The opening of chamber door 224 may allow remaining process gases in the inner chamber of the inner shell 216 to flow into the loading chamber 230. Gases begin to flow through vent line 262, for example because of the flushing of the inner chamber with a gas. As such, the inlet connection and the outlet connection of the detector 246 to vent line 262 may be opened when the chamber door 224 opens, allowing the detector 246 to monitor the levels of detected gases in the loading chamber 230. When the levels of detected gases fall beyond a preset threshold, the loading chamber may be opened and the wafer boat 232 may be removed for further processing. In some embodiments, the preset threshold for hydrogen gas may be about 0.001 ppm to about 0.1 ppm.

As discussed herein, a high pressure anneal process may be performed one or multiple times during the forming of a semiconductor device. For example, one or more high pressure anneal processes may be performed on a semiconductor device after the formation of an insulation material of an STI region, after the formation of an ILD layer over a dummy gate, and/or after the formation of an interconnect structure. The high pressure anneal processes may be wet anneal processes or dry anneal processes. In some embodiments, high pressure wet anneal processes may be performed on a semiconductor device after the formation of an insulation material of an STI region and/or after the formation of an ILD layer over a dummy gate. In some embodiments, a high pressure dry anneal process may be performed on a semiconductor device after the formation of an interconnect structure.

In some embodiments, the STI region and/or an ILD layer may be formed using a flowable CVD (FCVD) process. For example, a CVD-based material may be deposited (for example using a remote plasma system). A post curing conversion process may be used to make the CVD-based material convert to another material, such as an oxide. In some circumstances, the film conversion may not be complete. For example, in an example conversion process oxygen (or another suitable molecule) is diffused into a film to form an oxide. The oxygen may not diffuse as far into the film as is desired, or may not diffuse into some parts of the film in a sufficient concentration, leading to an incomplete film conversion. This problem may be exacerbated when oxygen is being diffused into an area of a film having a high aspect ratio, such as a STI region between two adjacent fins, or an ILD layer between two adjacent dummy gates. The failure of the film to fully convert into the desired oxide may result in undesirably high levels of impurities in the film, and/or may otherwise result in a poor quality film. In some embodiments, performing a high pressure wet anneal process may allow the oxygen to diffuse farther into the film, and/or may allow the oxygen to diffuse into some or all of the film in higher concentrations, which may achieve a more complete film conversion process. The high pressure wet anneal process may reduce the levels of impurities remaining in the film after the high pressure wet anneal process, and result in the creation of a higher quality film. In some embodiments, the high pressure wet anneal process may achieve a desired result (e.g. more complete film conversion) with a lower temperature being used for the wet anneal process.

In some devices, an interconnect region may contain one multiple layers of different materials. For example, the interconnect region may include multiple dielectric layers that are respectively separated by one or more etch stop layers. In some cases, dangling bonds may be present in the interconnect region between two adjacent layers (e.g. a dielectric layer and an etch stop layer). The high pressure dry anneal process may help to repair dangling bonds present along the interface. For example, during the high pressure dry anneal process molecules (e.g. $H_2$) may penetrate into the interconnect region to the interface, and may react with the dangling bonds to repair the dangling bonds. In this manner, defects may be repaired and reliability may be improved.

Further, the high pressure dry anneal process may help to fix imperfections in bonds in the channel region. For example, in some devices one or more dangling bonds may be present between a channel region and a gate dielectric layer. The dangling bonds may result in reduced channel mobility and/or poor recovery ability. The high pressure wet anneal process may help to repair the channel region dangling bonds, leading to higher mobility and improved recovery ability.

In some embodiments, a processing device for performing a high pressure anneal process includes an inner shell that is contained within an outer shell. The high pressure anneal process may be performed within the inner chamber of the inner shell. The outer shell may be formed of metal, and may be formed to withstand high pressures. For a high pressure dry anneal process, process gases may be provided to the device from pressurized bottles, and the process gases may flow from the bottles to the inner chamber of the inner shell using welded pipes, thereby raising the pressure of the inner shell to a desired pressure. For a high pressure wet anneal process, hot de-ionized (DI) water may flow from a containment vessel into the inner chamber of the inner shell, and the temperature of the processing device may convert the hot DI water to steam. Various valves and measurement devices may be provided along the piping. A wafer boat, disposed on a wafer chuck, may be provided to support one or more semiconductor devices during the high pressure anneal process.

Before the high pressure anneal process begins, the wafer chuck may be disposed remotely from the inner chamber of the inner shell, for example in a loading chamber adjacent to the outer shell. The wafer boat carrying semiconductor devices is loaded onto the wafer chuck. Upon initiation of the high pressure anneal process, the wafer chuck is moved into place, placing the wafer boat within the inner shell. The outer shell and the inner shell are sealed for the high pressure anneal. Pressurized gases or hot water (to create steam) are piped into the inner process chamber, thereby raising the pressure of the inner chamber to a desired pressure. The temperature is raised to the desired anneal temperature. After the high pressure anneal process terminates, an outlet may be provided to vent the process gases/steam from the inner process chamber. One or more burners may be used to burn off remaining process gases flowing through the outlet. In some embodiments, diluted nitrogen may be added to the process gas outlet to dilute the process gases in the outlet.

When a high pressure dry anneal process completes, the inner chamber of the inner shell may be flushed of combustible or poisonous gases using another, less dangerous gas. For example, nitrogen (or diluted nitrogen) is pumped into the inner process chamber to flush the chamber of combustible or poisonous gas. A gas detector is included in an outlet of the device, and detects the current levels of gases in the chamber. A controller connected to the gas detector controls the wafer chuck to remain in place in the inner chamber until the levels have dropped past a set point. After the levels drop to a set point, the controller controls the wafer chuck to be removed from its place in the inner chamber and to move to the loading chamber. The semiconductor devices may then be removed for subsequent processing.

A method is provided in accordance with some embodiments. The method includes etching a plurality of trenches in a substrate; depositing an insulating material in each trench of the plurality of trenches using a flowable chemical vapor deposition process; disposing the insulation material in a first pressurized environment, and performing a first anneal on the insulation material while the insulation material is in the first pressurized environment, wherein a pressure of the first pressurized environment is greater than 10 ATMs; thinning the insulation material to expose the substrate; forming a dummy gate over the substrate; forming an interlayer dielectric (ILD) surrounding the dummy gate; removing the dummy gate to form an opening; and forming a gate electrode in the opening. In an embodiments a temperature of the first anneal is between 200 C and 500 C. In an embodiment the first anneal is a wet anneal, and the first pressurized environment comprises steam. In an embodiment the method further includes forming a plurality of interconnect layers overlying the gate electrode; and after forming the plurality of interconnect layers, performing a second anneal in a second pressurized environment, wherein the second anneal is a dry anneal, and a pressure of the second pressurized environment is greater than 10 ATMs. In an embodiment the second pressurized environment comprises $H_2$ gas. In an embodiment the second pressurized environment comprises $D_2$ gas. In an embodiment the method also includes, after forming the ILD, performing a second anneal process in a second pressurized environment, wherein a pressure of the second pressurized environment is more than 10 ATMs. In an embodiment the second anneal process is a wet anneal process, and the second pressurized environment comprises steam. In an embodiment the first anneal reduces a concentration of nitrogen in the insulation material. In an embodiment depositing the insulating material in each trench of the plurality of trenches using the flowable chemical vapor deposition process comprises: depositing a first material using a chemical vapor deposition process; and converting the first material to a second material by diffusing molecules into the first material, wherein the first anneal increases a diffusion depth of the diffusing molecules.

In accordance with some embodiments, a method, includes: forming a dummy gate over a substrate; forming an interlayer dielectric (ILD) surrounding the dummy gate; removing the dummy gate to form an opening; filling the opening to form a gate electrode; and forming a plurality of interconnect layers over the ILD, each interconnect layer of the plurality of interconnect layers comprising a conductor extending through a dielectric layer; and after forming the plurality of interconnect layers, performing a first anneal process in a first pressurized environment, wherein the first anneal process is a dry anneal process that is performed using a process gas, and a pressure of the first pressurized environment is more than 10 ATMs. In an embodiment a temperature of the first anneal process is from 200 C to 500 C, and the process gas is deuterium gas. In an embodiment the method also includes, after forming the ILD, performing a second anneal process in a second pressurized environment, wherein the second anneal process is a wet anneal process that is performed using steam, and a pressure of the second pressurized environment is more than 10 ATMs. In an embodiment the method also includes forming a plurality of trenches in the substrate; and forming an insulating material in each trench of the plurality of trenches using a flowable chemical vapor deposition process. In an embodiment the method also includes performing a third anneal process on the insulation material in a third pressurized environment, wherein the third anneal process is a wet anneal process that is performed using steam, and a pressure of the third pressurized environment is higher than an atmospheric pressure. In an embodiment the pressure of the third pressurized environment is higher than 10 ATMs. In an embodiment a temperature of the third pressurized environment is from about 200 C to about 500 C. In an embodiment a temperature of the second pressurized environment is from about 200 C to about 500 C.

In accordance with some embodiments, a processing device includes: a main body, comprising: an outer shell having a chamber door, the chamber door being configured to be sealed shut by a high pressure lock, and the outer shell being capable of withstanding a pressure of at least 37 ATMs; and an inner shell disposed within the outer shell; a plurality of pressurized gas sources, each of the pressurized gas sources being connected to the main body by piping; a water source being connected to the main body by piping; a load chamber disposed adjacent to the main body; a vent line extending between the inner shell and a venting area, wherein the vent line comprises a plurality of cleaners that are configured to reduce a level of a process gas in the vent line; a detector coupled to the vent line, wherein the detector is configured to detect levels of hydrogen gas and oxygen gas in the vent line. In an embodiment the plurality of cleaners comprise one or more low swirl combustion burners.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A processing device comprising:
   a main body, comprising:
      an outer shell having a chamber door, the chamber door being configured to be sealed shut by a high pressure lock; and
      an inner shell disposed within the outer shell;
   a plurality of pressurized gas sources, each of the pressurized gas sources being connected to the main body by piping;
   a water source being connected to the main body by a first piping;
   a load chamber disposed adjacent to the main body;
   a vent line extending between the inner shell and a venting area, wherein the vent line comprises a plurality of cleaners that are configured to reduce a level of a process gas in the vent line; and
   a detector coupled to the vent line, wherein the detector is configured to detect levels of hydrogen gas and oxygen gas in the vent line.

2. The processing device of claim 1, wherein the plurality of cleaners comprises one or more combustion burners.

3. The processing device of claim 1, wherein the vent line comprises:
   a dry anneal vent line, the dry anneal vent line comprising the plurality of cleaners and the detector; and
   a wet anneal vent line.

4. The processing device of claim 3, wherein the wet anneal vent line comprises a water separator.

5. The processing device of claim 4 further comprising a first water separator outlet connected to the dry anneal vent line by a second piping.

6. The processing device of claim 5 further comprising a second water separator outlet connected to a third piping leading to the water source.

7. The processing device of claim 1 further comprising a nitrogen gas source connected to the vent line by a fourth piping.

8. The processing device of claim 7 further comprising a controller connected to the detector, the controller configured to adjust a flow of nitrogen gas from the nitrogen gas source to the vent line.

9. A processing device comprising:
   a processing chamber;
   a plurality of source inputs to the processing chamber;
   a vent line from the processing chamber;
   a dry anneal vent branch being connected to the vent line, the dry anneal vent branch comprising:
      a cleaner input line being connected to the vent line;
      a cleaner being connected to the cleaner input line; and
      a cleaner output line being connected to the cleaner; and
   a wet anneal vent branch being connected to the vent line, the wet anneal vent branch comprising:
      a water separator input line being connected to the vent line;
      a water separator being connected to the water separator input line;
      a gas outlet line from the water separator; and
      a water outlet line from the water separator.

10. The processing device of claim 9, further comprising a nitrogen source being connected to the cleaner output line.

11. The processing device of claim 10, wherein the cleaner output line feeds to a designated area in preparation for venting to an outside environment.

12. The processing device of claim 9, wherein the gas outlet line feeds into the cleaner output line.

13. The processing device of claim 9, wherein the plurality of source inputs comprises a water source, and wherein the water outlet line is configured to recirculate to the water source.

14. The processing device of claim 9, wherein the plurality of source inputs comprises a nitrogen source, a hydrogen source, and an oxygen source.

15. A processing device comprising:
  a processing chamber attached to a loading chamber, the processing chamber comprising:
    a process gas inlet;
    an inner chamber; and
    a gas outlet;
  a plurality of source materials connected to the process gas inlet of the processing chamber by inlet pipes;
  a process vent line connected to the gas outlet of the processing chamber; and
  a wet anneal vent system connected to the process vent line, the wet anneal vent system comprising:
    a water separator;
    a water separator inlet to the water separator;
    a first water separator outlet from the water separator; and
    a second water separator outlet from the water separator, the second water separator outlet being connected to the plurality of source materials.

16. The processing device of claim 15, further comprising a chemical detector connected to the process vent line, wherein the loading chamber comprises a chamber outlet pipe, and wherein the chamber outlet pipe is connected to the chemical detector.

17. The processing device of claim 15, further comprising a dry anneal vent system, the dry anneal vent system comprising:
  a cleaner, the cleaner comprising at least one of a scrubber or a burner;
  a cleaner inlet to the cleaner; and
  a cleaner outlet from the cleaner.

18. The processing device of claim 17, wherein the first water separator outlet is connected to the cleaner outlet.

19. The processing device of claim 17, wherein the dry anneal vent system comprises a nitrogen source connected to the cleaner outlet.

20. The processing device of claim 17, wherein a chamber outlet pipe connects the loading chamber to the cleaner inlet of the dry anneal vent system.

* * * * *